US011533101B1

(12) United States Patent
Pecen et al.

(10) Patent No.: US 11,533,101 B1
(45) Date of Patent: *Dec. 20, 2022

(54) COMMUNICATING INFORMATION USING PHOTONIC CRYSTAL MASERS

(71) Applicant: Quantum Valley Ideas Laboratories, Waterloo (CA)

(72) Inventors: Mark Pecen, Waterloo (CA); Hadi Amarloo, Waterloo (CA); James P. Shaffer, Kitchener (CA)

(73) Assignee: Quantum Valley Ideas Laboratories, Waterloo (CA)

( * ) Notice: Subject to any disclaimer, the term of this patent is extended or adjusted under 35 U.S.C. 154(b) by 0 days.

This patent is subject to a terminal disclaimer.

(21) Appl. No.: 17/667,281

(22) Filed: Feb. 8, 2022

(51) Int. Cl.
| | |
|---|---|
| *H04B 10/11* | (2013.01) |
| *H04B 7/185* | (2006.01) |
| *H01S 5/11* | (2021.01) |
| *H01S 1/06* | (2006.01) |
| *H04B 10/118* | (2013.01) |
| *H04B 10/50* | (2013.01) |
| *H01Q 15/24* | (2006.01) |

(52) U.S. Cl.
CPC ......... *H04B 7/18515* (2013.01); *H01Q 15/24* (2013.01); *H01S 1/06* (2013.01); *H01S 5/11* (2021.01); *H04B 10/118* (2013.01); *H04B 10/503* (2013.01); *H04B 10/11* (2013.01); *H04B 2210/006* (2013.01)

(58) Field of Classification Search
CPC .............. H04B 7/18515; H04B 10/118; H04B 10/503; H04B 2210/006; H04B 10/11; H01Q 15/24; H01S 1/06; H01S 5/11

USPC .................................................. 398/115–131
See application file for complete search history.

(56) References Cited

U.S. PATENT DOCUMENTS

| | | | |
|---|---|---|---|
| 2,929,922 A | 3/1960 | Schawlow et al. | |
| 3,192,472 A | 6/1965 | Bender et al. | |
| 5,999,308 A * | 12/1999 | Nelson | B82Y 20/00 |
| | | | 359/332 |

(Continued)

OTHER PUBLICATIONS

Timofeev et al, Generation of high field narrowband terahertz radiation by counterpropagating plasma wakefields, Nov. 2016, Physics of Plasmas, All Document. (Year: 2016).*

(Continued)

*Primary Examiner* — Dibson J Sanchez
(74) *Attorney, Agent, or Firm* — Henry Patent Law Firm PLLC

(57) ABSTRACT

In a general aspect, a communication system comprises a first station and a second station. The first station includes a photonic crystal maser, a laser subsystem, and a tracking subsystem. A photonic crystal structure of the photonic crystal maser is formed of dielectric material and has an array of cavities and an elongated slot. The elongated slot is disposed in a defect region of the array of cavities. The photonic crystal maser also includes a vapor disposed in the elongated slot and operable to emit a target RF electromagnetic radiation in response to receiving an optical signal. The array of cavities and the elongated slot define a waveguide configured to form the target RF electromagnetic radiation, when emitted, into a beam. The second station includes a receiver configured to couple to the beam of target RF electromagnetic radiation.

30 Claims, 11 Drawing Sheets

(56) References Cited

U.S. PATENT DOCUMENTS

| | | | | |
|---|---|---|---|---|
| 6,075,640 | A * | 6/2000 | Nelson | G02F 1/0126 |
| | | | | 359/239 |
| 6,265,945 | B1 * | 7/2001 | Delaney | G04F 5/145 |
| | | | | 331/3 |
| 6,744,792 | B1 * | 6/2004 | Tayebati | G04F 5/14 |
| | | | | 368/10 |
| 6,816,112 | B1 * | 11/2004 | Chethik | B82Y 10/00 |
| | | | | 977/950 |
| 7,323,941 | B1 * | 1/2008 | Happer | G01R 33/26 |
| | | | | 331/3 |
| 7,821,704 | B1 * | 10/2010 | Pepper | H01S 3/06708 |
| | | | | 359/344 |
| 8,571,373 | B2 * | 10/2013 | Wang | G02F 1/035 |
| | | | | 385/27 |
| 8,906,470 | B2 | 12/2014 | Overstolz et al. | |
| 9,203,203 | B2 | 12/2015 | Benabid et al. | |
| 10,135,544 | B1 | 11/2018 | Klee et al. | |
| 10,605,840 | B1 | 3/2020 | Amarloo et al. | |
| 10,859,981 | B1 | 12/2020 | Ramirez-Serrano et al. | |
| 11,137,432 | B1 | 10/2021 | Amarloo et al. | |
| 11,303,086 | B1 | 4/2022 | Amarloo et al. | |
| 11,303,087 | B1 | 4/2022 | Amarloo et al. | |
| 11,402,479 | B1 | 8/2022 | Pecen et al. | |
| 2002/0163394 | A1 * | 11/2002 | Hollberg | G04F 5/145 |
| | | | | 331/94.1 |
| 2002/0175767 | A1 * | 11/2002 | Kitching | G04F 5/14 |
| | | | | 331/3 |
| 2004/0202050 | A1 * | 10/2004 | Happer | G04F 5/14 |
| | | | | 368/10 |
| 2005/0007118 | A1 | 1/2005 | Kitching et al. | |
| 2006/0039649 | A1 * | 2/2006 | Gomyo | G02B 6/1228 |
| | | | | 385/132 |
| 2006/0076518 | A1 * | 4/2006 | Barker | G01J 3/10 |
| | | | | 250/504 R |
| 2006/0147213 | A1 | 7/2006 | Rosenwald et al. | |
| 2007/0228355 | A1 * | 10/2007 | Singh | B82Y 10/00 |
| | | | | 977/950 |
| 2007/0247241 | A1 * | 10/2007 | Braun | G04F 5/14 |
| | | | | 331/94.1 |
| 2009/0323732 | A1 * | 12/2009 | Benabid | H01S 3/305 |
| | | | | 372/3 |
| 2010/0067918 | A1 * | 3/2010 | Federici | G02B 6/12004 |
| | | | | 398/140 |
| 2010/0108916 | A1 * | 5/2010 | Barker | G01N 21/3581 |
| | | | | 250/495.1 |
| 2010/0321117 | A1 * | 12/2010 | Gan | G04F 5/14 |
| | | | | 331/3 |
| 2011/0001063 | A1 | 1/2011 | Barker et al. | |
| 2011/0012036 | A1 * | 1/2011 | Gordon | G02F 1/353 |
| | | | | 250/493.1 |
| 2011/0097045 | A1 | 4/2011 | Benabid | |
| 2011/0114856 | A1 * | 5/2011 | Cooke | B82Y 20/00 |
| | | | | 250/492.1 |
| 2011/0169405 | A1 * | 7/2011 | Baik | H01J 25/34 |
| | | | | 216/13 |
| 2013/0037721 | A1 * | 2/2013 | Ouchi | G02B 6/4296 |
| | | | | 250/353 |
| 2014/0248020 | A1 | 9/2014 | Fujita et al. | |
| 2015/0316832 | A1 * | 11/2015 | Sato | G02F 1/0136 |
| | | | | 359/326 |
| 2016/0178843 | A1 | 6/2016 | Fujita et al. | |
| 2016/0226597 | A1 * | 8/2016 | Eerkens | H04B 13/00 |
| 2018/0069372 | A1 * | 3/2018 | Maki | H01S 5/06804 |
| 2019/0187198 | A1 | 6/2019 | Anderson et al. | |
| 2020/0209656 | A1 * | 7/2020 | Young | H04L 9/0852 |
| 2021/0114926 | A1 | 4/2021 | Ramirez-Serrano et al. | |
| 2021/0156898 | A1 | 5/2021 | Amarloo et al. | |
| 2021/0285992 | A1 | 9/2021 | Amarloo et al. | |
| 2021/0285993 | A1 | 9/2021 | Amarloo et al. | |
| 2021/0286063 | A1 | 9/2021 | Amarloo et al. | |
| 2021/0325516 | A1 | 10/2021 | Johnson et al. | |
| 2022/0196716 | A1 * | 6/2022 | Anderson | G01R 29/0892 |

OTHER PUBLICATIONS

Nagatsuma et al., "Advances in terahertz communications accelerated by photonics", May 2016, Nature Photonics, All Document. (Year: 2016).*

Burford et al, Review of terahertz photoconductive antenna technology, Jan. 2017, Optical Engineering, All Document. (Year: 2017).*

Feng et al, Highly Efficient Spintronic Terahertz Emitter Enabled by Metal Dielectric Photonic Crystal, Oct. 2018, Adv.Optical Mater., All Document. (Year: 2018).*

Dunn et al., High speed modulation of a terahertz quantum cascade laser by coherent acoustic phonon pulses, Feb. 2020, Nature Communications, All Document. (Year: 2020).*

Fedorov et al., Powerful terahertz waves from long wavelength infrared laser filaments, Nov. 2020, Light: Science & Applications, All Document. (Year: 2020).*

USPTO, Ex Parte Quayle action dated Jan. 5, 2022, in U.S. Appl. No. 17/514,819, 15 pgs.

USPTO, Notice of Allowance dated Oct. 8, 2021, in U.S. Appl. No. 17/142,017, 23 pgs.

USPTO, Non-Final Office Action dated Jun. 15, 2021, in U.S. Appl. No. 17/142,017, 29 pgs.

USPTO, Notice of Allowance dated Jul. 21, 2021, in U.S. Appl. No. 17/142,012, 32 pgs.

WIPO, International Search Report and Written Opinion dated Dec. 30, 2021, in PCT/CA2021/051530, 9 pgs.

Anderson , et al., "An atomic receiver for AM and FM radio communication", arXiv:1808.08589v1, Aug. 26, 2018, 6 pgs.

Cox , et al., "Quantum-Limited Atomic Receiver in the Electrically Small Regime", arXiv:1805.09808v2, Jun. 19, 2018, 6 pgs.

Dharanipathy , "On the Investigation of Light-Matter Interactions in Slab Photonic Crystal Cavities", Thesis EPFL, Feb. 21, 2014, 186 pgs.

Dhillon , et al., "The 2017 terahertz science and technology roadmap", Journal of Physics D: Applied Physics, 2017, 49 pgs.

Dmytryszyn , et al., "Lasers for Satellite Uplinks and Downlinks", Sci 2021, Jan. 4, 2021, 20 pgs.

Fan , et al., "Atom based RF electric field sensing", Journal of Physics B: Atomic, Molecular and Optical Physics, Sep. 9, 2015, 17 pgs.

Gosele , et al., "Wafer bonding for microsystems technologies", Sensors and Actuators 74, 161-168, 1999, 8 pgs.

Gregory, et al., "TESAT Laser Communication Terminal Performance Results on 5.6 GBIT Coherent Inter Satellite and Satellite to Ground Links", Int'l Conf. on Space Optics, Oct. 4, 2010, 6 pgs.

Lugiato , et al., "Connection between microscopic and macroscopic maser theory", PhysRevA 36,2, Jul. 15, 1987, 4 pgs.

Masteika , et al., "A Review of Hydrophilic Silicon Wafer Bonding", ECS Journal of Solid State Science and Technology, 3 (4) Q42-Q54, 2014, 13 pgs.

Meyer , et al., "Digital Communication with Rydberg Atoms & Amplitude-Modulated Microwave Fields", arXiv:1803.03545v2, Oct. 29, 2018, 10 pgs.

Moi , et al., "Rydberg-atom masers. I. A theoretical and experimental study of super-radiant systems in the millimeter-wave domain", PhysRevA 27, Apr. 4, 1983, 22 pgs.

Moll , et al., "Demonstration of high-rate laser communications from fast airborne platform: flight campaign and results", Proc. of SPIE vol. 9248, 2014, 6 pgs.

Narducci , et al., "Multimode laser with an injected signal: Steady-state and linear stability analysis", Phys.Rev.A, 32, Sep. 1985, 8 pgs.

Nozaki , et al., "Photonic-crystal nano-photodetector with ultrasmall capacitance for on-chip light-to-voltage conversion without an amplifier", Optica, vol. 3, No. 5, May 5, 2016, 10 pgs.

Riesing , "Development of a Pointing, Acquisition, and Tracking System for a Nanosatellite Laser Communications Module", MIT Thesis, Sep. 2015, 127 pgs.

Schuler , et al., "Graphene Photodetector Integrated on a Photonic Crystal Defect Waveguide", ACS Photonics, Nov. 13, 2018, 6 pgs.

(56) References Cited

OTHER PUBLICATIONS

Scullion, et al., "Slotted Photonic Crystal Sensors", Sensors 2013, 13, 3675-3710, Mar. 15, 2013, 36 pgs.
Sedlacek, et al., "Microwave electrometry with Rydberg atoms in a vapour cell using bright atomic resonances", Nature Physics 8, Nov. 2012, 6 pgs.
Silfvast, "Laser Fundamentals, Second Edition", Cambridge University Press, 2004, 670 pgs.
Suni, et al., "Effects of Plasma Activation on Hydrophilic Bonding of Si and SiO2", Journal of the Electrochemical Society, 149 (6) G348-G351, 2002, 4 pgs.
Vuckovic, "Quantum optics and cavity QED with quantum dots in photonic crystals", Lectures given at Les Houches 101th summer school on "Quantum Optics and Nanophysics", Aug. 2013, 37 pgs.
Withayachumnankul, et al., "Integrated Silicon Photonic Crystals Toward Terahertz Communications", Advanced Optical Materials Jun. 16, 2018, 7 pgs.
Ziegler, "A Jam-Resistant CubeSat Communications Architecture", MIT Thesis, Jun. 2017, 140 pgs.
USPTO, Notice of Allowance dated Apr. 25, 2022, in U.S. Appl. No. 17/667,244, 15 pgs.
Fan, et al., "Effect of Vapor-Cell Geometry on Rydberg-Atom-Based Measurements of Radio-Frequency Electric Fields", Physical Review Applied 4, 044015, 2015, 7 pgs.
Sedlacek, et al., "Atom-Based Vector Microwave Electrometry Using Ribidium Rydberg Atoms in a Vapor Cell", Physical Review Letters, Aug. 6, 2013, 5 pgs.
Abari, et al., "Millimeter Wave Communications: From Point-to-Point Links to Agile Network Connections", Nov. 2016, 7 pgs.
Burnside, et al., "Design of an inertially stabilized telescope for the LLCD", SPIE LASE 2011, 2011, 9 pgs.
Holloway, et al., "Detecting and Receiving Phase Modulated Signals with a Rydberg Atom-Based Mixer", arXiv:1903.10644v1, Mar. 26, 2019, 5 pgs.
Sargent III, et al., "Laser Physics", Optical Sciences Center, Univ. of Arizona, 1974, 457 pgs.
USPTO, Notice of Allowance dated Feb. 11, 2022, in U.S. Appl. No. 17/514,819, 10 pgs.
WIPO, International Search Report and Written Opinion dated Jan. 18, 2022, in PCT/CA2021/051529, 11 pgs.
USPTO, Notice of Allowance dated Feb. 16, 2022, in U.S. Appl. No. 17/514,758, 22 pgs.
Serpengüzel, "Transmission Characteristics of Metallodielectric Photonic Crystals and Resonators", IEEE Microwave and Wireless Components Letters, vol. 12, No. 4, Apr. 2002, 3 pgs.
Yablonovitch, "Inhibited Spontaneous Emission in Solid-State Physics and Electronics", PRL 58, 20, May 18, 1987, 4 pgs.
Barnes, et al., "Injection Seeding I: Theory", IEEE Journal of Quantum Electronics, vol. 29, No. 10, Oct. 1993, 14 pgs.

* cited by examiner

COMMUNICATING INFORMATION USING PHOTONIC CRYSTAL MASERS

BACKGROUND

The following description relates to communicating information using photonic crystal masers.

Communication systems may include stations that transmit and receive wireless signals to move information between the stations. During propagation, a wireless signal may be radiated outward, or alternatively, focused along a path into a beam. The beam may allow two or more stations of the communication system to communicate in a point-to-point mode. Such point-to-point communication may allow secure transmission of the information, as a beam is less prone to being intercepted. A beam may also require less power for its propagation between two stations than a broad spherical emission. Lasers have traditionally been utilized for point-to-point communications due to their beam-like emissions. However, laser beams are susceptible to scattering by common atmospheric phenomena such as clouds, rain, fog, snow, dust, and so forth. This scattering can attenuate the intensity of a laser beam, reducing its capability to deliver signals between two stations.

DETAILED DESCRIPTION

Figure 1A:
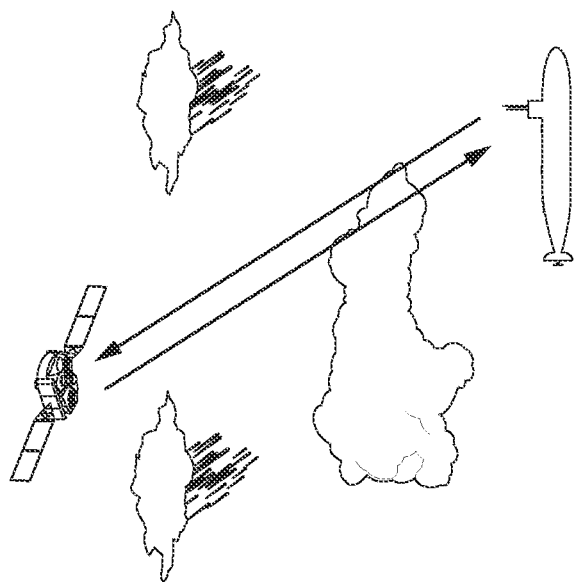
FIG. 1A is a schematic diagram of an example communication system that includes a satellite and a submarine partially submerged within a body of water.

In a general aspect, a communication system comprises a first station and a second station. The first station includes a photonic crystal maser, a laser subsystem, and a tracking subsystem. The photonic crystal maser includes a photonic crystal structure formed of dielectric material. The photonic crystal structure has an array of cavities and an elongated slot disposed in a defect region of the array of cavities. The photonic crystal maser also includes a vapor disposed in the elongated slot and operable to emit a target RF electromagnetic radiation in response to receiving an optical signal. The array of cavities and the elongated slot define a waveguide configured to form the target RF electromagnetic radiation, when emitted, into a beam. The beam of target RF electromagnetic radiation represents information to be transmitted to a second station of the communication system. The laser subsystem includes a pump laser optically coupled to the elongated slot and configured to generate the optical signal. The laser subsystem also includes signal processing electronics in communication with the pump laser and configured to control one or more properties of the optical signal. The one or more properties of the optical signal comprising at least one of an intensity, a phase, or a frequency of the optical signal. The tracking subsystem is configured to control an orientation of the photonic crystal maser, thereby pointing the beam of target RF electromagnetic radiation towards a target location.

The second station of the communication system includes a receiver configured to couple to the beam of target RF electromagnetic radiation. In some variations, the receiver is a photonic crystal receiver that includes a second photonic crystal structure formed of dielectric material. The second photonic crystal structure has a second array of cavities and a second elongated slot disposed in a defect region of the second array of cavities. The photonic crystal receiver includes an antenna structure configured to couple the beam of target RF electromagnetic radiation to a second waveguide defined by the second array of cavities and the second elongated slot. The second waveguide is configured to concentrate the coupled beam in the second elongated slot. The photonic crystal receiver additionally includes a second vapor disposed in the second elongated slot. In these variations, the second station includes a second laser subsystem having one or more input lasers optically coupled to the second elongated slot and configured to provide input optical signals thereto. The input optical signals are adapted to interact with one or more electronic transitions of the second vapor. The second station also includes an optical subsystem configured to generate spectroscopic data based on output optical signals from the second vapor. The spectroscopic data represents one or more properties of the beam of target RF electromagnetic radiation. The second station additionally includes a data processing subsystem configured to generate a time series of data based on the spectroscopic data over time. The time series of data represents the information transmitted from the first station.

In some implementations, the communication system is a point-to-point communication system. In these implementations, the communication system may use the beam of RF electromagnetic radiation as a directional means to communicate information from the first station to the second station (or vice versa). Point-to-point communications using narrow beamwidths can be useful for a number of reasons. For example, point-to-point directional communications can allow for jam-resistant communications. Point-to-point communications can also be secure as an adversary needs to intercept the beam to listen to the message. Moreover, point-to-point communications can allow for better utilization of the frequency spectrum since directional beams do not create as much interference as traditional radio frequency (RF) systems.

In certain cases, the beam of RF electromagnetic radiation used by the communication system may offer advantages over systems using beams of light emitted by lasers. Lasers in the visible and near infrared frequency ranges have been the primary workhorse of point-to-point communications because lasers generate highly directional emissions and can be relatively compact when compared with standard RF systems. A major disadvantage of laser-based systems, however, is that they do not work well in common atmospheric conditions, such as rain, snow, dust, smoke, fog, and cloud cover (if transmission through clouds is required). In particular, the atmospheric particles (e.g., raindrops) are larger than the laser wavelengths and can thus scatter beams of visible and near-infrared light.

Radiofrequency (RF) electromagnetic radiation, on the other hand, can penetrate rain, snow, dust, fog, and cloud cover. RF electromagnetic radiation is not commonly used for point-to-point communications because the corresponding RF transmitters have poor directionality. For example, the RF antennas typically emit beams with angular spreads of over several degrees. In contrast, an RF maser can emit with high directionality. However, these masers are bulky and only function at a small number of frequencies, such as those associated with molecular transitions that are conducive for maser operation (e.g., ammonia). To make a RF point-to-point directional communications system, a compact maser that works at relevant frequencies is required. The photonic crystal maser of the communication system is such a device. The photonic crystal maser, which may be a Rydberg atom maser, can be paired with a photonic crystal receiver (e.g., or a Rydberg atom receiver) to form a transceiver based on the same technology. The photonic crystal maser can serve as the transmitting component (Tx) of the transceiver while the photonic crystal receiver can serve as the receiving component (Rx). In many implementations, both the photonic crystal maser and the photonic crystal receiver are all dielectric devices that are coupled to a signal processing and laser system for control. However, in some implementations, the receiver component (Rx) may be a conventional receiver (e.g., an antenna).

Pointing the photonic crystal maser from a transceiver to the receiver on the second station may be facilitated by a tracking system on one or both of the first and second stations. For example, the first station may be a satellite station and the second station may be a terrestrial station. The tracking system on the first station may operate to point the photonic crystal maser at the terrestrial station. As another example, the first station may be a lunar station and the second station may be an earth station. In this example, the first and second stations may each include one or more photonic crystal masers and one or more photonic crystal receivers that define a transceiver. The tracking systems of the first and second stations may be operable to point the transceiver of the first at the second stations and vice versa.

Many different systems are possible to encode the communications between the first and second stations. For example, the intensity of the beam of RF electromagnetic radiation can be modulated at the first station, the second station, or both. On-off keying and pulse position modulation are two potential schemes for intensity modulation that can be used. Phase shift keying, differential phase shift keying, frequency shift keying, or polarization shift keying can also be used. These latter schemes can be implemented if the photonic crystal maser is injection seeded with a stable RF signal, such as from a reference RF oscillator. Injection seeding (or locking) fixes the phase and frequency of the maser output, and in some variations, links it to a stable clock signal. To use polarization shift keying, two orthogonal photonic crystal masers can be used with different polarizations, along with two receivers with high polarization sensitivity (e.g., two orthogonal photonic crystal receivers). The phase and frequency (or generally, phase or angle) can be determined by heterodyned measurements that use the synchronized photonic crystal maser at each transceiver.

The first and second station may be part of or define a point-to-point communication system. Point-to-point communication can be inherently more secure and cause less interference than traditional communication systems. Spoofing is also more difficult with a point-to-point communication system since it is more difficult to direct radiation from a spoofing transmitter into a receiver that is pointed towards a target transmitter. Point-to-point communications may also allow stealth applications. For stealth applications, the power levels of the beam of RF electromagnetic radiation can be lower than what is required for non-directed radiation (e.g., spherically broadcast radiation). The size, weight, and power (SWaP) can also be reduced compared to a traditional RF system. The antennas of the point-to-point communication system can be relatively small and the communication channels can be located over a broad range of frequencies. Moreover, the point-to-point communication system can operate at multiple frequencies.

Lasers have traditionally been used for satellite communications and other point-to-point systems because of their availability. Lasers are highly directional and can be made relatively compact. However, radio-frequency radiation (e.g., 1 MHz-300 GHz) is advantageous for communications, when compared to light, because it can better penetrate rain, snow, dust, cloud cover, and fog, particularly in some radio-frequency bands. But radio-frequency systems are not generally used for point-to-point communications because radio-frequency systems tend to have poor directionality. In many cases, radio-frequency antennas emit over a spread of several degrees or more. A radio-frequency maser can be used to reduce this spread due to a high degree of directionality of its emission. However, to date, radio-frequency masers are bulky and can only function at an extremely limited number of frequencies. Thus, to make a radio-frequency point-to-point communication system that is practical and has directionality similar to a laser, a compact maser, operating at relevant frequencies, can be paired with a receiver to construct a directional, radio-frequency transceiver.

In many implementations, the photonic crystal masers described herein are configured to emit directional RF electromagnetic radiation, for example, a beam of RF electromagnetic radiation. Such masers can be used in the stations of a point-to-point communication system. The photonic crystal masers may operate using Rydberg atom-based sensing technology. Rydberg atom-based sensing technology uses quantum interference of internal energy states, including Rydberg states, of an atom to detect electromagnetic radiation. This operating process is self-calibrating, sensitive, electromagnetically transparent, and sub-wavelength. Other advantages are possible. Rydberg atom-based sensing technology can work over a frequency range from MHz-THz and can also be used to produce a maser that functions on practically any Rydberg atom transition. To do so, the maser may use a photonic crystal cavity to promote masing on the transition. A photonic crystal cavity may also be used to make an ultrasensitive receiver (or photonic crystal receiver). This receiver can be ultrasensitive to both polarization and RF electric field. The photonic crystal receiver can also be self-calibrated and all-dielectric.

The photonic crystal maser can be combined with a receiver (e.g., a traditional receiver or a photonic crystal receiver) to construct a Rydberg atom-based transceiver. The transceiver can be used for point-to-point communications between stations of a communication system. Multiple transceivers, or multiple receivers and multiple photonic crystal masers, can be grouped together to form multi-frequency and/or multi-polarization and/or multi-channel communication system. The photonic crystal maser in the transceiver can be injection seeded with a phase and frequency stable RF wave so as to fix the phase and frequency of the photonic crystal maser. The injection seed can be phase or frequency modulated to frequency or phase modulate the output of the photonic crystal maser in order to encode signals. Phase and frequency encoding may allow schemes such as differential phase shift keying, phase shift keying, or frequency shift keying. The intensity of the photonic crystal maser can be modulated using one or more pump lasers. Modulating the pump lasers can be a way to implement intensity modulation encoding schemes, such as on-off key shifting and pulse position modulation. The injection-locked photonic crystal maser or a second injection-locked photonic crystal maser can be used in conjunction with the receiver for heterodyne or homodyne detection approaches. Such approaches may allow for frequency or phase encoding for the communications system. An RF field referenced to the clock can also be used for hetero- and homo-dyne measurements.

In some implementations, the communication system may be configured for defense or military applications. Because the communication system uses very narrow, coherent beams from photonic crystal masers for transmitting information, such transmission can allow point-to-point communication between stations (e.g., the first and second stations) of the communication system. The high directivity for transmit and receive functions can make such communications jam resistant and secure. The directionality of the communication link also reduces interference. Moreover, using radio-frequencies enables better penetration of fog, cloud cover and other forms of precipitation than light generated by a laser. Laser light systems have been demonstrated for both terrestrial and space born systems. But with amplification of a photonic crystal maser, it may be possible to create a Rydberg technology space-born communications system.

The directional transceiver of the communication system can also be used to securely transmit or relay position, navigation and timing (PNT)+information between GPS open and GPS denied areas as well as serve as the backbone of a beacon system for GPS denied PNT. Another example of the utility of the transceiver is communications between ships in weather, particular for military applications where security and reduced detection of the transmitters is essential. For example, the communication system can be used to create a quiet, secure communications between the ships forming a carrier group. The inner screen is about 19 km which is within the horizon for a Zumwalt class destroyer (e.g., at about 22 km). The outer screen, 22-45 km, is within point-to-point capability with the inner screen. As a consequence, the inner and outer screen can setup a secure communication system with the main section of the carrier group. The outer pickets are out of point-to-point range as they are positioned at about 370 km.

Figure 1B:
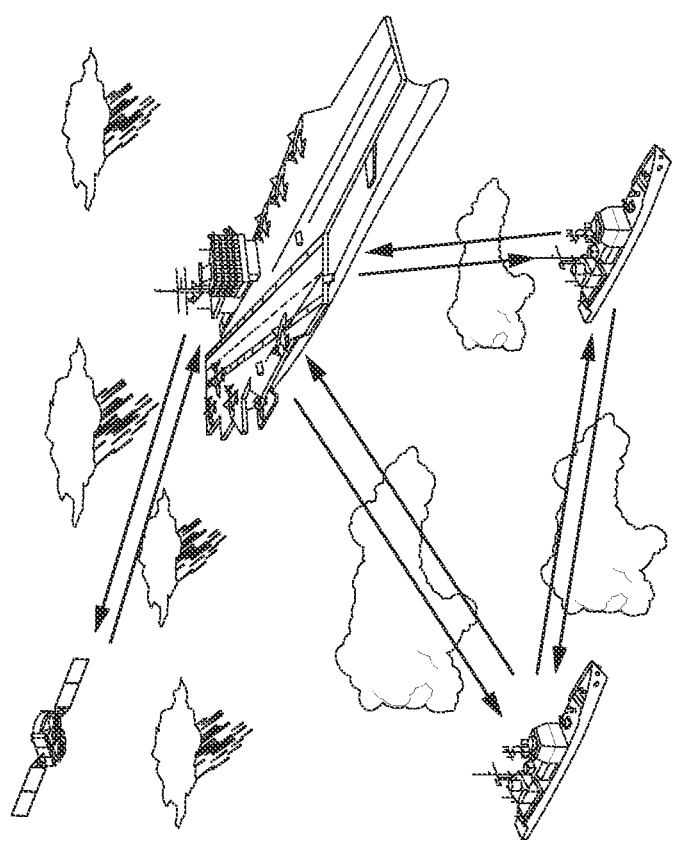
FIG. 1B is a schematic diagram of an example communication system that includes a satellite and multiple ships deployed on a body of water.
Figure 1C:
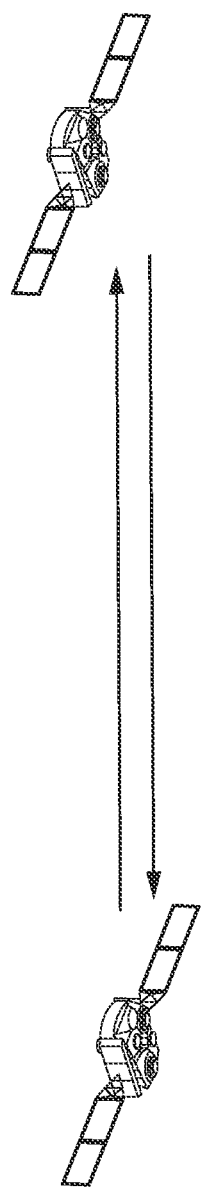
FIG. 1C is a schematic diagram of an example communication system that includes a pair of satellites.

In some variations, satellite communications can be utilized to relay communications to the screens, particularly the picket line. FIGS. 1A-1C present respective schematic diagrams of example communication systems that are deployed in various environments. In FIGS. 1A-1B, for example, it is easy to see that radio frequencies have many advantages over light in situations where the consequences of losing the communication channel due to weather is unacceptable. Note that signal lamps are still used by navies. The communication system can reliably replace signal lamps with something that penetrates weather better and has a much larger data rate.

FIG. 1A presents a schematic diagram of an example communication system that includes a satellite and a submarine partially submerged within a body of water. The satellite and the submarine may serve as, respectively, first and second stations of the example communication system. However, the satellite may also be a relay station of the example communication system. The ambient environment of the example communication system includes clouds, precipitation (e.g., rain), and the body of water in which the submarine is partially submerged. Moreover, the satellite and the submarine may engage in bidirectional point-to-point communication. FIG. 1B presents a schematic diagram of an example communication system that includes a satellite and multiple ships deployed on a body of water. The satellite and ships may serve as respective stations of the example communication system. Similar to FIG. 1A, the ambient environment of the communication system in FIG. 1B includes clouds and precipitation (e.g., rain). The satellite and the ships of the fleet may engage in bidirectional point-to-point communication with each other. FIG. 1C presents a schematic diagram of an example communication system that includes a pair of satellites. The pair of satellites may serve as first and second stations of the example communication system, which may include being part of a relay chain of the example communication system (e.g., the first and second stations are each relay stations). However, other types of aerial stations are possible. For example, drones are another area where point-to-point communications between a satellite of the communication system can be useful. In some instances, the communications system may have use in drone control, naval communications, satellite communications, and generally military communications, among other secure communications applications.

A point-to-point communication system can bring multiple advantages. As described above, point-to-point communications are inherently more secure because they are harder to intercept than traditional communications. When point-to-point communications can be used, such communications can be quiet or stealthy. Point-to-point communications can also reduce interference and allow more efficient use of the available electromagnetic spectrum (e.g. RF spectrum). However, a major hurdle for using point-to-point communications in the RF domain is the lack of highly directed RF transmitters. Antennas, even most multi-element antennas, have broad spatial emission. Moreover, traditional masers can be used to generate highly directional RF beams but only exist for select frequencies. In addition, the known maser systems are limited in the frequencies that they can generate. On the other hand, light has been used for point-to-point communications largely due to the availability of lasers. Wide adoption of point-to-point communications for secure and quiet applications using light is hindered by the fact that precipitation, dust, and clouds scatter light efficiently, making operation under these conditions impractical. However, RF electromagnetic radiation can penetrate precipitation, dust and clouds better than light. Moreover, the reliability of RF electromagnetic radiation for point-to-point communications can be superior to light if a directional maser source can be used.

In clear weather, the atmospheric transmission of wavelengths of around 1 cm or less are roughly equivalent to the near infrared atmospheric transmission bands. For point-to-point communication there would be little difference in choosing radiation at these wavelengths. However, in rain fall at about 0.25 mm/hr, the attenuation of infrared frequencies is over an order of magnitude more than for radio frequency wavelengths. For attenuation measured in decibels per kilometer, radio frequency wavelengths suffer a loss of about 0.02 dB/km while infrared suffers about 0.7 dB/km. For fog at 0.1 g/m$^3$, the effect can be even more dramatic. Whereas for radio frequency wavelengths fog is irrelevant to attenuation, the attenuation in the infrared increases by four orders of magnitude to about 200 dB/km. For heavy rain at 25 mm/hr, radio frequency wavelengths can be attenuated by as much as about 1 dB/km, but infrared is attenuated substantially more at about 10 dB/km. These dramatic differences in attenuation in common weather conditions show that a point-to-point communications system built around a Rydberg atom maser is useful when high fidelity communication is desired.

Figure 2A:
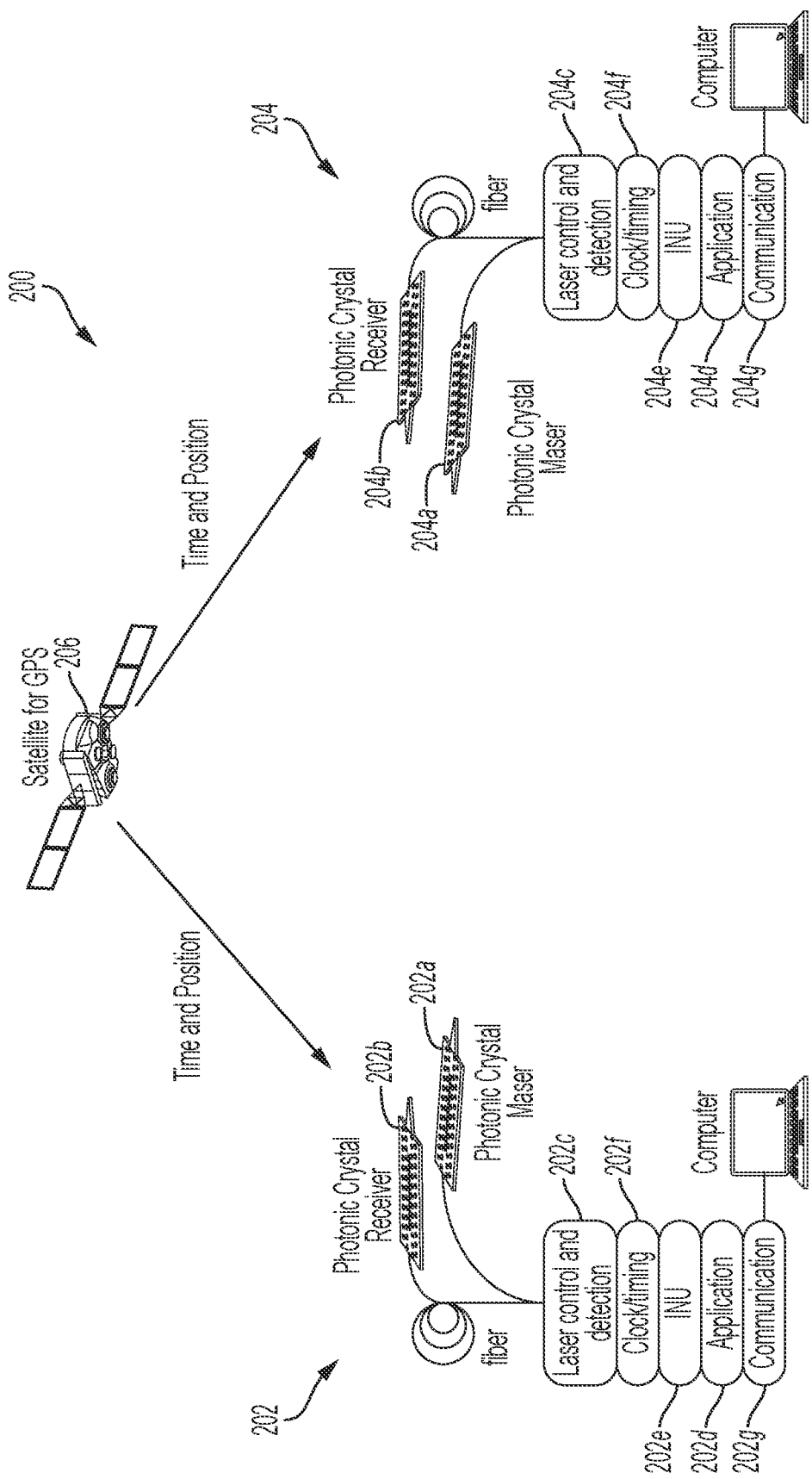
FIG. 2A is a schematic diagram of an example communication system that includes a first station and a second station.

FIG. 2A presents a schematic diagram of an example communication system 200 that includes a first station 202 and a second station 204. The first station 202 includes a photonic crystal maser 202a, and in some variations as shown in FIG. 2A, also includes a photonic crystal receiver 202b. The photonic crystal maser 202a and the photonic crystal receiver 202b may be part of or define a transceiver of the first station 202. The second station 204 may include a receiver configured to couple to the beam of target RF electromagnetic radiation. The receiver may be a conventional receiver, or as shown in FIG. 2A, be a photonic crystal receiver 204b. In some variations, the second station 204 also includes a photonic crystal maser 204a. In these variations, photonic crystal maser 204a and the photonic crystal receiver 204b may be part of or define a transceiver of the second station 204. In some variations, the photonic crystal masers 202a, 204a and receivers 202b, 204b are, respectively, Rydberg atom masers and receivers. In these variations, the photonic crystal masers 202a, 204a and receivers 202b, 204b may include respective vapors that are defined by gaseous Rydberg atoms (e.g., Group IA atoms, such as Rb and Cs).

In these implementations, the photonic crystal masers 202a, 204a each include a photonic crystal structure formed of dielectric material. The photonic crystal structure has an array of cavities and an elongated slot disposed in a defect region of the array of cavities. The photonic crystal masers 202a, 204a each also include a vapor disposed in the elongated slot and operable to emit a target RF electromagnetic radiation in response to receiving an optical signal. The array of cavities and the elongated slot define a waveguide configured to form the target RF electromagnetic radiation, when emitted, into a beam. The beam of target RF electromagnetic radiation represents information to be transmitted to another station of the communication system (e.g., the second station 204 in the case of the photonic crystal maser 202a, the first station in the case of the photonic crystal maser 204a, etc.). Features of the photonic crystal masers 202a, 204a are described further in relation to FIG. 3A.

In implementations having a photonic crystal receiver (e.g., the photonic crystal receiver 202b or 204b), the photonic crystal receiver includes a second photonic crystal structure formed of dielectric material and having a second array of cavities and a second elongated slot. The second elongated slot is disposed in a defect region of the second array of cavities. The photonic crystal receiver also includes an antenna structure configured to couple a beam of target RF electromagnetic radiation to a second waveguide defined by the second array of cavities and the second elongated slot. The antenna structure may be an integral part of the second photonic crystal structure. The second waveguide is configured to concentrate the coupled beam in the second elongated slot. The photonic crystal receiver additionally includes second vapor disposed in the second elongated slot. In some variations, the antenna structure includes a polarizer configured to filter a polarization of the beam of target RF electromagnetic radiation. Features of the photonic crystal receiver are described further in relation to FIG. 3B.

In some implementations, the photonic crystal maser 202a may serve as a transmitter (or Tx component) of a transceiver for the first station 202. Similarly, the photonic crystal maser 204a may serve as a transmitter (or Tx component) of a transceiver for the second station 204. In some implementations, photonic crystal receiver 202b may serve as a receiver (or Rx component) of the transceiver of the first station 202. Similarly, the photonic crystal receiver 204b may serve as a receiver (or Rx component) of the transceiver of the second station 204. During operation, the photonic crystal masers 202a, 204a and the photonic crystal receivers 202b, 204b may allow the first and second stations 202, 204 to operate in a point-to-point communication mode using beams of RF electromagnetic radiation. For example, the photonic crystal maser 202a of the first station 202 may transmit a beam of RF electromagnetic radiation to the second station 204. The photonic crystal receiver 204b of the second station 204 may receive the beam of RF electromagnetic radiation by coupling its antenna structure thereto.

In many implementations, the photonic crystal masers 202a, 204a are Rydberg atom masers. Rydberg atom masers can operate at virtually any frequency ranging from MHz to THz. For example, the Rydberg atom maser may be resonant with a waveguide mode of a waveguide defined by a photonic crystal structure of the Ryberg atom maser. This resonance may allow the Rydberg atom maser to function at a specific chosen frequency, and the vapor cell structure in the dielectric body can be changed to allow the Rydberg atom maser to operate at almost any frequency within this range. In some implementations, the photonic crystal receivers 202b, 204b are Rydberg atom receiver. In these implementations, a single laser system may be used to run the Tx and Rx components of a transceiver. For example, an agile laser system that can be switched or can operate at multiple frequencies can be used to support multiple transceivers in a station of the communication system. Multiple lasers can also be used to operate multiple transceivers. The Rydberg atom receiver can benefit from characteristics such as being dielectric (so multiple receivers can be grouped with minimal interference), highly sensitive, and driven by the same laser, control, and signal processing package as the Rydberg atom maser in the transceiver. In some variations, the Rydberg atom maser can be amplified in a photonic crystal waveguide vapor cell such as a structure similar to the Rydberg atom receiver or in a vapor cell.

In some implementations, the first station 202 includes a laser subsystem 202c having a pump laser and signal processing electronics. The pump laser is optically coupled (e.g. via fiber optics) to the elongated slot of the photonic crystal maser 204a and configured to generate the optical signal. In some instances, multiple pump lasers may be present. The signal processing electronics are in communication with the pump laser and configured to control one or more properties of the optical signal. The one or more properties of the optical signal include at least one of an intensity, a phase, or a frequency of the optical signal. In further instances, the one or more properties of the optical signal include a polarization of the optical signal.

In some implementations, the laser subsystem 202c includes one or more input lasers optically coupled to the second elongated slot of the photonic crystal receiver 202b and configured to provide input optical signals thereto. In some instances, the one or more input lasers may include the pump laser. The input optical signals adapted to interact with one or more electronic transitions of the second vapor of the photonic crystal receiver 202b. The laser subsystem 202c also includes an optical subsystem configured to generate spectroscopic data based on output optical signals from the second vapor. The spectroscopic data represents one or more properties of a beam of target RF electromagnetic radiation from another station of the communication system 200 (e.g., the second station 204). In some variations, the one or more properties of the beam of target RF electromagnetic radiation includes at least one of an intensity, a phase, or a frequency of the beam. For variations in which the antenna structure of the photonic crystal receiver includes a polarizer (e.g., the photonic crystal receivers 202b or 204b), the one or more properties may include a polarization of the beam. In many variations, such as shown in FIG. 2A, the second station 204 includes a laser subsystem 204c analogous to that described in relation to the first station 202.

In some implementations, the first station 202 includes a data processing subsystem 202d (or application subsystem) configured to generate a time series of data based on the spectroscopic data over time. The time series of data represents the information transmitted from another station of the communication system 200 (e.g., the second station 204). In some instances, the data processing subsystem 202d may be part of the laser subsystem 202c. In many variations, such as shown in FIG. 2A, the second station 204 includes a data processing subsystem 204d analogous to that described in relation to the first station 202.

In some implementations, one or both of the first and second stations 202, 204 include respective tracking subsystems 202e, 204e. The tracking subsystems 202e, 204e may include an inertial navigation unit (INU). Each tracking subsystem 202e, 204e is configured to control an orientation of the transceiver associated with the first or second station 202, 204. For example, the tracking subsystem 202e may control an orientation of the transceiver of the first station 202, thereby controlling an orientation of the photonic crystal maser 202a to point the beam of target RF electromagnetic radiation emitted therefrom towards a target location. In some variations, the target location is a first target location and the tracking subsystem 204e of the second station 204 points its transceiver towards a second target location. In these variations, the first and second stations 202, 204 may be disposed at, respectively, the second and first locations. As such, the transceiver of the first station 202 points at the second station and vice versa. However, other orientations are possible.

Figure 2B:
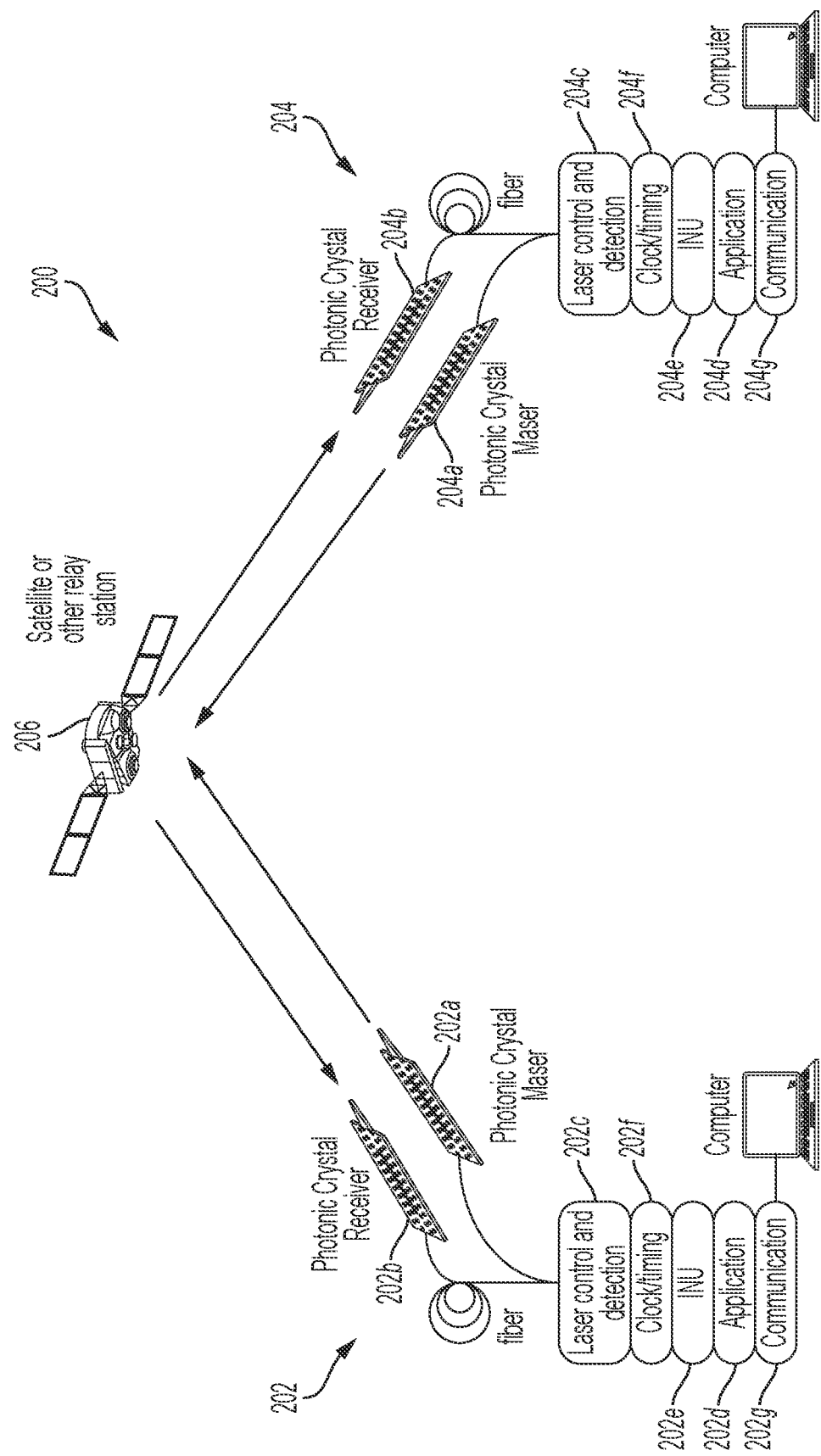
FIG. 2B is a schematic diagram of the example communication system of FIG. 2A, but in which a satellite serves as a relay station of the example communication system.

For example, the communication system 200 could include a relay station (e.g., a satellite, a drone, an aircraft, a ship, a tower, etc.) disposed at a relay location and configured to receive and transmit beams of target RF electromagnetic radiation. One or both of the first and second target locations could correspond to the relay location. FIG. 2B presents a schematic diagram of the example communication system 200 of FIG. 2A, but in which a satellite 206 serves as a relay station of the example communication system. The transceivers of the first and second stations 202, 204 are oriented to point at the satellite 206.

Moreover, the first and second stations 202, 204 are engaged in bidirectional point-to-point communication with the satellite 206. As such, the satellite 206 may be configured analogously to the first and second stations 202, 204 (e.g., serve as a third station of the communication system 200). Although FIG. 2B shows relay station, the satellite 206 could be part of a chain of relay stations, such as a terminal end. In this case, the first station 202 could point to the satellite 206 and the second station 204 could point to another relay station of the chain.

The tracking subsystems 202e, 204e may be configured to actively lock the pointing of the first and second stations 202, 204 to secure a communications channel, which may include moving target locations (e.g., a plane, a drone, etc.). The tracking subsystems 202e, 204e may include a gimballed mount to independently point the receiver and transmitter and moveable optics (e.g., a. mirror on a 3-axis tilt stage) to fine tune the pointing. An inertial navigation unit can assist in the pointing of the transceiver. However, in some variations, a beacon, or series of beacons, can be used to improve the pointing until a communications link can be established. Once the link is established, the pointing and tracking can be actively locked to maintain the channel.

The photonic crystal masers 202a, 204a can be frequency modulated, phase modulated, or amplitude modulated in order to encode signals. The receiver signal can be demodulated using the local maser radiation using techniques such as homodyne or heterodyne detection. Photonic crystal masers at different stations can be coherent with each other by using the clock signal from the inertial navigation unit, which could be an atomic clock or GPS timing signal. FIG. 2A shows the case where the satellite is operable to provide a GPS signal that includes timing and position information.

In some implementations, one or both of the first and second stations 202, 204 includes a reference RF subsystem configured to generate a reference RF electromagnetic radiation having one or both of a controlled frequency and a controlled phase. In some variations, the reference RF subsystem includes a reference RF oscillator (e.g., an atomic clock) and may be part of a clock and timing subsystem of the first or second stations 202, 204 (e.g., clock and timing subsystems 202f, 204f). The clock and timing subsystem is configured to synchronize communication signals between its station and other stations of the communication system 200. The clock and timing subsystem is also configured to serve as a stable reference for the photonic crystal maser(s) of its station (e.g., through injection locking). The clock and timing subsystem may also be configured to assist the tracking subsystem of its station, such as to establish a communication channel between its station and another station of the communication system 200.

In cases where the first station 202 includes the reference RF subsystem, the photonic crystal maser 202a may include an input coupler configured to couple the reference RF electromagnetic radiation to its waveguide. Similarly, in cases where the second station 204 includes the reference RF subsystem, the photonic crystal maser 204a may include an analogous input coupler. The input couplers of the photonic crystal masers 202a, 204a may be an integral part of their respective photonic crystal structures. The reference RF subsystem, when present, may allow the photonic crystal masers 202a, 204a to be injection locked. For example, the masers can be injection locked with a small RF oscillator signal that is referenced to a clock signal from the clock and timing subsystem. In some variations, timing accuracy of about 1 part in $10^{11}$ is possible. However, in further variations, timing accuracy of about ~1 part in $10^{13}$ is possible (e.g., for a portable system).

Polarization modulation is also possible by using, for example, two orthogonally polarized photonic crystal masers and two photonic crystal receivers oriented to receive orthogonal polarizations. In addition to redundancy, multiple transceivers in the first and second stations 202, 204 can be used to increase the bandwidth of the communication system 200. For example, the bandwidth of a single photonic crystal maser and receiver pair can be about 20 MB/s. It is possible to drive such a system with a single laser system, such as one based on a frequency comb.

In some implementations, one or both of the first and second stations 202, 204 includes a reference antenna configured to generate a second reference RF electromagnetic radiation. The second reference RF electromagnetic radiation has one or more controlled properties that comprise at least one of a controlled amplitude, a controlled frequency, or a controlled phase. The reference antenna is electromagnetically coupled to the receiver (e.g., a conventional receiver, the antenna structure of photonic crystal receivers 202b, 204b, etc.). During operation the reference antenna may superimpose the second reference RF electromagnetic radiation onto an input beam of RF electromagnetic radiation received by the receiver. Such supposition may cause interference between the second reference RF electromagnetic radiation and the input beam of RF electromagnetic radiation, thus allowing the phase and frequency of the input beam of RF electromagnetic radiation to be determined relative to the reference field.

In some implementations, the first and second stations 202, 204 each include a communications interface (e.g., communications interface 202g, 204g). In these implementations, the data processing subsystem 202d, 204d takes the signal (voice, video, codecs, etc.) from a respective communications interface 202g, 204g, formats it for transmission, and sends it to the signal processing electronics of a laser subsystem. To aid in such operation, the signal processing electronics may include modulation electronics. The data processing subsystem 202d, 204d controls synchronization and maintains the connection, including handling signaling packets. Likewise, the data processing subsystem 202d, 204d may take the raw data from a photonic crystal receiver and signal process the raw data to format a signal for a respective communications interface 202g, 204g. Some forms of demodulation may partially happen in the photonic crystal receivers 202b, 204b such as in heterodyne or homodyne detection of the signal. Once the received signal is processed, it is formatted for output to the respective communications interface 202g, 204g.

Figure 3A:
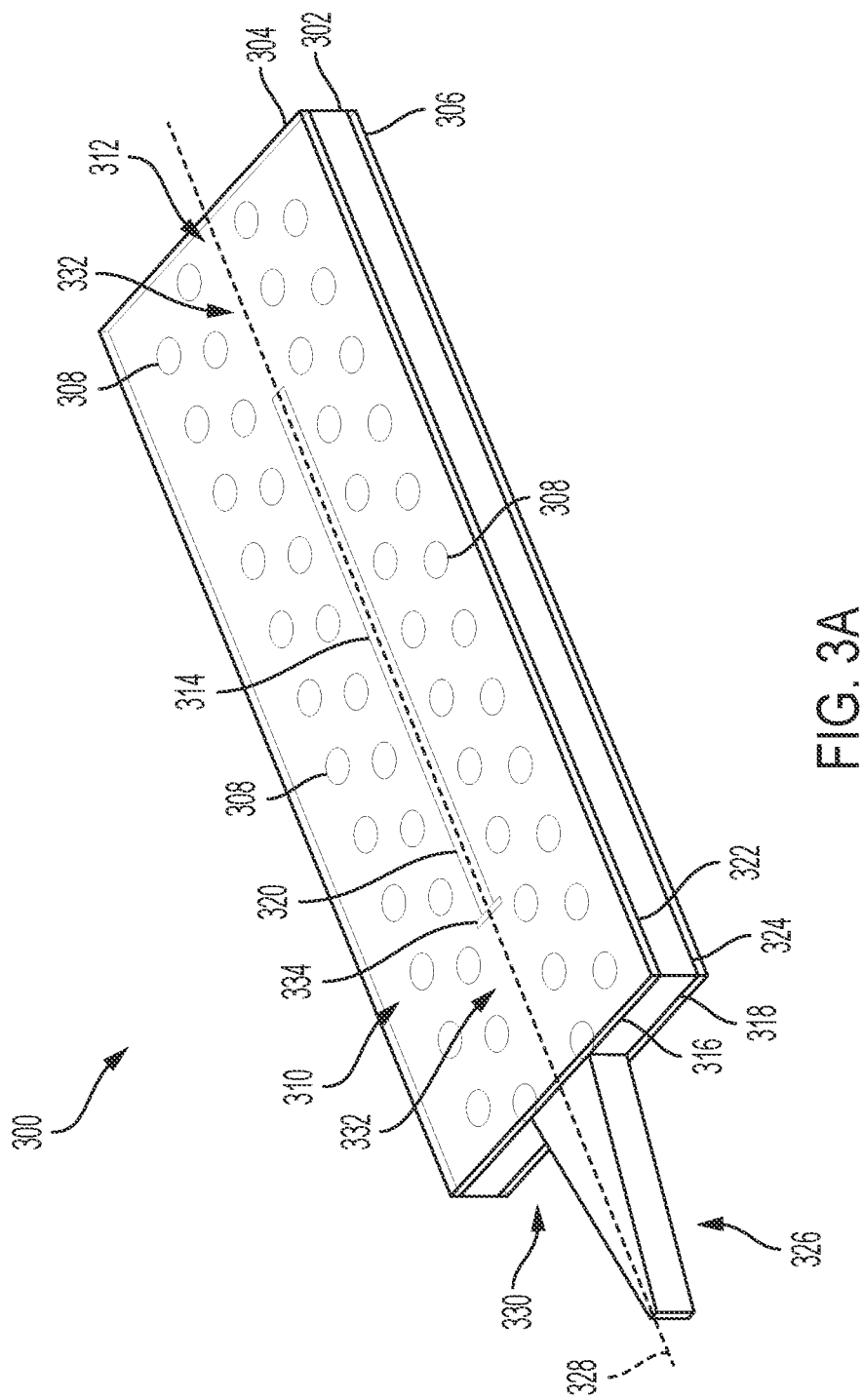
FIG. 3A is a schematic diagram, in perspective view, of an example photonic crystal maser that includes a dielectric body bonded to two optical windows.

Now referring to FIG. 3A, a schematic diagram is presented, in perspective view, of an example photonic crystal maser 300 that includes a dielectric body 302 bonded to two optical windows 304, 306. The example photonic crystal maser 300 may be analogous to the photonic crystal masers 202a, 204a described in relation to FIGS. 2A and 2B. The dielectric body 302 includes an array of cavities 308 ordered periodically to define a photonic crystal structure 310 in the dielectric body 302. For example, the cavities 308 of the array may be disposed on respective sites of a two-dimensional lattice, such as an oblique lattice, a square lattice, a rectangular lattice, a hexagonal lattice, a rhombic lattice, and so forth. In FIG. 3A, each cavity 308 is defined by a through-hole. However, other shapes are possible for the cavities 308 (e.g., blind holes, internal voids, etc.), including combinations of shapes. The dielectric body 302 also includes a region 312 (or defect region) in the array of cavities 308 defining a defect in the photonic crystal structure 310. The region may be defined by an absence of cavities 308 on two or more contiguous sites of a two-dimensional lattice. In FIG. 3A, the region 312 is a linear region having a row of cavities 308 absent. However, other geometries are possible, including curved, circular, elliptical, serpentine, square, rectangular, hexagonal, and so forth.

The dielectric body 302 may be formed of a material substantially transparent to RF electromagnetic radiation. The material may be an insulating material having a high resistivity, e.g., $\rho>10^3$ $\Omega\cdot$cm, and may also correspond to a single crystal material, a polycrystalline material, or an amorphous (or glass) material. For example, the dielectric body 302 may be formed of silicon. In another example, the dielectric body 302 may be formed of a glass that includes silicon oxide (e.g., $SiO_2$, $SiO_x$, etc.), such as vitreous silica, a borosilicate glass, or an aluminosilicate glass. In some instances, the material of the dielectric body 302 is an oxide material such as magnesium oxide (e.g., MgO), aluminum oxide (e.g., $Al_2O_3$), silicon dioxide (e.g., $SiO_2$), titanium dioxide (e.g., $TiO_2$), zirconium dioxide, (e.g., $ZrO_2$), yttrium oxide (e.g., $Y_2O_3$), lanthanum oxide (e.g., $La_2O_3$), and so forth. The oxide material may be non-stoichiometric (e.g., $SiO_x$), and may also be a combination of one or more binary oxides (e.g., $Y:ZrO_2$, $LaAlO_3$, etc.). In certain variations, the combination may correspond to $BaLn_2Ti_4O_{12}$ where Ln refers to one or more elements from the lanthanide group of the periodic table of elements. In other instances, the material of the dielectric body 302 is a non-oxide material such as silicon (Si), diamond (C), gallium nitride (GaN), calcium fluoride (CaF), and so forth.

The dielectric body 302 additionally includes an elongated slot 314 through the region 312 extends from a slot opening in a surface of the dielectric body 302 at least partially through the dielectric body. In FIG. 3A, the elongated slot 314 extends completely through dielectric body 302 to a second slot opening. The array of cavities 308 and the elongated slot 314 define a waveguide having a waveguide mode. During operation, the waveguide may direct radio frequency (RF) electromagnetic radiation (or waves thereof) along an axis of the region 312, such as towards an end of the dielectric body 302.

The example photonic crystal maser 300 also includes a vapor (or a source of the vapor) in the elongated slot 314. The vapor may include constituents such as a gas of alkali-metal atoms, a noble gas, a gas of diatomic halogen molecules, or a gas of organic molecules. For example, the vapor may include a gas of alkali-metal atoms (e.g., K, Rb, Cs, etc.), a noble gas (e.g., He, Ne, Ar, Kr, etc.), or both. In another example, the vapor may include a gas of diatomic halogen molecules (e.g., $F_2$, $Cl_2$, $Br_2$, etc.), a noble gas, or both. In yet another example, the vapor may include a gas of organic molecules (e.g., acetylene), a noble gas, or both. Other combinations for the vapor are possible, including other constituents. The source of the vapor may generate the vapor in response to an energetic stimulus, such as heat, exposure to ultraviolet radiation, irradiation by laser light, and so forth. For example, the vapor may correspond to a gas of alkali-metal atoms and the source of the vapor may correspond to an alkali-metal mass sufficiently cooled to be in a solid or liquid phase when disposed into the elongated slot 114.

In many implementations, the vapor has electronic transitions that are defined between pairs of electron energy levels (e.g., a Rydberg transition, an atomic transition, a molecular transition, etc.). In particular, the vapor includes one or more input electronic transitions and an output electronic transition coupled to the one or more input electronic transitions. The output electronic transition is operable to emit a target RF electromagnetic radiation and is resonant with one or more waveguide modes of the waveguide. In some implementations, the example photonic crystal maser 300 includes a laser (e.g., a pump laser of a laser subsystem) configured to generate an optical signal capable of exciting the one or more input electronic transitions of the vapor. In some implementations, the output electronic transition is operable to emit a target RF electromagnetic radiation having a frequency in a range from 100 MHz to 1 THz.

The photonic crystal structure 310 may define a photonic band gap for the target RF electromagnetic radiation in the waveguide. The photonic band gap may be for a transverse magnetic (TM) mode, a transverse electric (TE) mode, or both, of the target RF electromagnetic radiation in the waveguide. The photonic band gap may allow the photonic crystal structure 310 to influence properties of the target RF electromagnetic radiation. For example, the photonic crystal structure 310 may be configured to concentrate the target RF electromagnetic radiation in the elongated slot 314. The photonic crystal structure 310 may also be configured to decrease a group velocity of the target RF electromagnetic radiation (or waves thereof) along a direction of the elongated slot 314 (e.g., along an axis of the elongated slot 314). Such influence may allow the photonic crystal structure 310 to control an absorption and emission of photons by the vapor.

In some implementations, the elongated slot 314 extends partially through the dielectric body 302 and the dielectric body 302 includes a surface defining a slot opening of the elongated slot 314. In these implementations, the example photonic crystal maser 300 includes an optical window (e.g., optical window 304) that covers the elongated slot 314 and has a window surface bonded to the surface to form a seal about the slot opening. Such a seal may assist the optical window and dielectric body 302 in sealing the vapor (or the source of the vapor) in the elongated slot 314, thereby defining a vapor cell within the region 312. The optical window may be bonded to the dielectric body 302 using a contact bond, an anodic bond, a glass frit bond, and so-forth. Such bonds may be formed using techniques described in U.S. Pat. No. 10,859,981 entitled "Vapor Cells Having One or More Optical Windows Bonded to a Dielectric Body," the disclosure of which, is incorporated herein by reference in its entirety.

The optical window may be formed of a material that is transparent to electromagnetic radiation (e.g., laser light) used to stimulate the vapor to emit the target RF electromagnetic radiation. For example, the optical window may be transparent to infrared wavelengths of electromagnetic radiation (e.g., 700-5000 nm), visible wavelengths of electromagnetic radiation (e.g., 400-700 nm), or ultraviolet wavelengths of electromagnetic radiation (e.g., 10-400 nm). Moreover, the material of the optical window may be an insulating material having a high resistivity, e.g., $p>10^3$ $\Omega \cdot cm$, and may also correspond to a single crystal material, a polycrystalline material, or an amorphous (or glass) material. For example, the material of the optical window may include silicon oxide (e.g., $SiO_2$, $SiO_x$, etc.), such as found within quartz, vitreous silica, or a borosilicate glass. In another example, the material of the optical window may include aluminum oxide (e.g., $Al_2O_3$, $Al_xO_y$, etc.), such as found in sapphire or an aluminosilicate glass. In some instances, the material of the optical window is an oxide material such as magnesium oxide (e.g., MgO), aluminum oxide (e.g., $Al_2O_3$), silicon dioxide (e.g., $SiO_2$), titanium dioxide (e.g., $TiO_2$), zirconium dioxide, (e.g., $ZrO_2$), yttrium oxide (e.g., $Y_2O_3$), lanthanum oxide (e.g., $La_2O_3$), and so forth. The oxide material may be non-stoichiometric (e.g., $SiO_x$), and may also be a combination of one or more binary oxides (e.g., $Y:ZrO_2$, $LaAlO_3$, $BaLn_2Ti_4O_{12}$, etc.). In other instances, the material of the optical window is a non-oxide material such as diamond (C), calcium fluoride (CaF), and so forth.

In some implementations, the surface of the dielectric body 102 defines a cavity opening for each of the array of cavities 108. The optical window may or may not cover each of the cavity openings. In implementations where the optical window does cover each of the cavity openings, the window surface of the optical window may form a seal about each of the cavity openings.

In some implementations, the elongated slot 314 extends entirely through the dielectric body 302. For example, as shown in FIG. 3A, the dielectric body 302 may include a first surface 316 opposite a second surface 318 and the elongated slot 314 extends through the dielectric body 302 from the first surface 316 to the second surface 318. The first surface 316 may define a first slot opening 320 for the elongated slot 314 and the second surface 318 may define a second slot opening (not shown) for the elongated slot 314. In these implementations, the example photonic crystal maser 300 includes first and second optical windows 304, 306 covering, respectively, the first and second slot openings of the elongated slot 314. The first and second optical windows 304, 306 each have a window surface bonded to the surface of the dielectric body 1302 and may seal the vapor (or the source of the vapor) in the elongated slot 314 to define a vapor cell. In such cases, the first optical window 304 may cover the first slot opening 320 and may have a first window surface 322 bonded to the first surface 316 of the dielectric body 302 to form a seal about the first slot opening 120. Similarly, the second optical window 306 may cover the second slot opening and may have a second window surface 324 bonded to the second surface 318 of the dielectric body 302 to form a seal about the second slot opening.

In implementations where the example photonic crystal maser 300 includes first and second optical windows 304, 306, the first and second surfaces 316, 318 of the dielectric body 302 may define, respectively, first and second cavity openings for each of the array of cavities 308. In these implementations, the first and second optical windows 304, 306 may or may not cover, respectively, each of the first and second cavity openings. In implementations where they do, the first window surface 322 may form a seal about each of the first cavity openings and the second window surface 324 may form a seal about each of the second cavity openings.

In some implementations, the example photonic crystal maser 300 includes an output coupler 326 configured to impedance match the target RF electromagnetic radiation to an ambient environment of the photonic crystal maser 300. The output coupler 326 may assist the waveguide in forming the target RF electromagnetic radiation, when emitted, into a beam. In these implementations, the region 312 in the array of cavities 308 may extend along an axis 328 and the elongated slot 314 may be aligned parallel to the axis 328 (e.g., be coincident with the axis 328). The dielectric body 302 then includes the output coupler 326, which may extend from an end 330 of the dielectric body 302 and be aligned with the axis 328. The output coupler 326 may be an integral part of the dielectric body 302 (or photonic crystal structure 310) but may also be a separate body. If separate, the output coupler 326 may be formed of dielectric material. However, the output coupler 326 may also be a conventional coupler formed of metal. FIG. 3A shows the output coupler 326 as a protrusion from the dielectric body 302 that terminates in a taper. However, other geometries for the output coupler 326 are possible.

In some implementations, the output coupler 326 is electromagnetically coupled to an output mirror, such as a photonic crystal mirror 332, to impedance match an output beam to a medium (e.g., air) in which the output beam is intended to propagate. The photonic crystal mirror 332 may be defined by one or more offset cavities spatially offset from an ideal periodic position in the array. The one or more offset cavities may reside nearest an end of the elongated slot 314 (e.g., end 330) and have respective spatial offsets away from the end of the elongated slot 314. The one or more offset cavities may also reside nearest a side of the elongated slot 314 and have respective spatial offsets away from the side of the elongated slot 314. Other locations are possible. A lens may also be added to collimate the output beam. In some variations, the elongated slot 214 may be tapered (e.g., in width along its axis). Such tapering may assist in the formation of the photonic crystal mirror 332.

In some implementations, a polarizer may be added to the output coupler 326 to filter a polarization of the output beams. For example, the output coupler 126 may terminate in a tapered end and include a narrow portion aligned with the tapered end. An array of co-planar segments may extend outward from the narrow portion and have a periodic spacing therealong. The array of co-planar segments is configured to filter a polarization of the target RF electromagnetic radiation.

In some implementations, the photonic crystal mirror 332 is placed at one or both ends of the elongated slot 314. FIG. 3A shows the case in which the photonic crystal mirror 332 is present at both ends of the elongated slot 314. The presence of the photonic crystal mirror 318 may increase the output power, may lower the gain threshold of the maser, or both. For example, the photonic crystal mirror 332 may reflect electromagnetic radiation that traverses the region 312 during operation (e.g., the target RF electromagnetic radiation emitted by the vapor during operation of the example photonic crystal maser 300). In this capacity, the region 312 may serve as part of a maser cavity, such as the interior of a maser cavity. Moreover, the photonic crystal mirror 332 may assist the array of cavities 308 and the elongated slot 314 in defining a cavity structure (e.g., a slot waveguide) for electromagnetic radiation emitted by the vapor. A taper in the elongated slot 314, if present, may also assist in the photonic crystal mirror 332 in defining the cavity structure for electromagnetic radiation emitted by the vapor.

In many variations, the photonic crystal mirror 332 corresponds to an alteration in the dimensional characteristics of the photonic crystal structure 310 near an end of the elongated slot 314. For example, transmission of the target RF electromagnetic radiation through the photonic crystal structure 310 at the ends of the elongated slot 314 can be altered by changing a spacing of cavities 308 in the array, a thickness of the dielectric body 302, a diameter of the cavities 308 in the array, and so forth. It will be appreciated that, in the dielectric body 302, a perfect photonic crystal geometry for the target RF electromagnetic radiation (or resonant wave) may act as a perfect reflector, while the absence of the photonic crystal may act as a perfect transmitter.

In some implementations, the photonic crystal mirror 332 is configured with a reflectivity greater than 80% for frequencies of electromagnetic radiation at or near a cavity resonant frequency, $\omega_c$, of the photonic crystal structure 310. This reflectivity may increase a cavity quality factor, Q, associated with the photonic crystal structure 310 (or region 312 therein), thereby lowering a threshold condition for masing to take place. In some variations, the reflectivity is greater than 85%. In some variations, the reflectivity is greater than 90%. In some variations, the reflectivity is greater than 92%. In some variations, the reflectivity is greater than 94%. In some variations, the reflectivity is greater than 96%.

In some implementations, an optical mirror 334 is placed at one or both ends of the elongated slot 314. The optical mirror 334 may be angled relative to an optical pathway defined by the elongated slot 314, or alternatively, be angled perpendicular to the optical pathway. The optical mirror 334 may serve to guide optical signals along a longitudinal axis of the elongated slot, such as axis 328. To do so, the optical mirror 334 may include surfaces configured to reflect such optical signals. The optical signals may include light received into the elongated slot 314 from the laser (e.g., the pump laser).

In some implementations, the vapor is a vapor of atoms (e.g., Rydberg atoms) in which each atom can function as an emitter. During operation, the photonic crystal structure 310, which surrounds the elongated slot 314, may slow and concentrate an electromagnetic wave at an atomic transition frequency of the atoms. The atoms are pumped with the laser(s) so that a population inversion is established on an atomic transition, which is resonant with a resonant mode (or waveguide mode) of the waveguide. Emission of radiation into the resonant mode of the waveguide can be enhanced because the electric field is stronger, favoring emission. Stimulated emission dominates, creating a coherent directed maser beam along the waveguide that can be impedance matched and shaped for free-space propagation. Photonic crystal mirrors can be implemented at the ends of the elongated slot 314 so the radiation can propagate back and forth in the elongated slot 314 and be further amplified. The elongated slot 314 takes the energy stored in the population inversion and causes it to be emitted into the waveguide mode of the waveguide, resulting in a coherent, directed beam of radiation. Analogous operation is possible for implementations of the example photonic crystal maser 300 in which the vapor is a vapor of molecules.

The example photonic crystal maser 300 may be constructed in a manner suitable for mass production. The amount of power outputted by the example photonic crystal maser 300 may be controlled to extraordinarily low levels by changing an intensity of the optical signal provided by the laser. Moreover, the switching time may be nanoseconds because cavity lifetimes can be on this scale. Because of the nanosecond lifetimes and the ability to modulate the laser at GHz bandwidths, modulating the laser can imprint baseband modulations on the carrier frequency on the same frequency scale (e.g., GHz).

The example photonic crystal maser 300 may also be combined with a Rydberg atom receiver, Rydberg atom vapor cell sensor, or array of Rydberg atom vapor cell sensors to create devices that can receive and transmit RF electromagnetic radiation. For example, as shown in FIGS. 2A and 2B, a photonic crystal maser is paired with a photonic crystal receiver to define part or all of a transceiver.

Figure 3B:
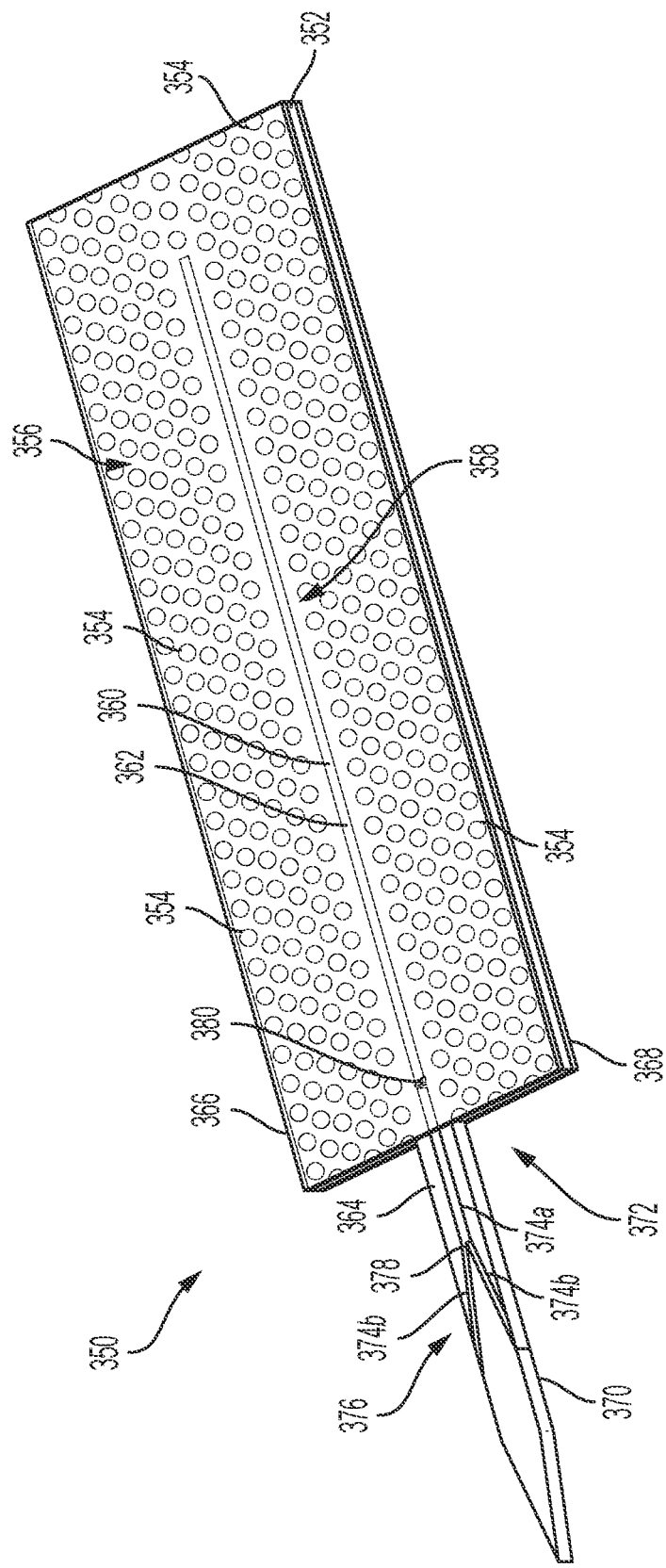
FIG. 3B is a schematic diagram, in perspective view, of an example photonic crystal receiver for sensing a beam of radio frequency (RF) electromagnetic radiation.

Now referring to FIG. 3B, a schematic diagram is presented, in perspective view, of an example photonic crystal receiver 350 for sensing a beam of radio frequency (RF) electromagnetic radiation. The example photonic crystal receiver 350 may be analogous to the photonic crystal receiver 202b, 204b described in relation to FIGS. 2A and 2B. The example photonic crystal receiver 350 includes a dielectric body 352, which may be formed of a material substantially transparent to RF electric fields (or RF electromagnetic radiation) measured by the example photonic crystal receiver 350. The material may be an insulating material having a high resistivity, e.g., $\rho > 10^3$ $\Omega \cdot cm$, and may also correspond to a single crystal material, a polycrystalline material, or an amorphous (or glass) material. For example, the dielectric body 352 may be formed of silicon. In another example, the dielectric body 352 may be formed of a glass that includes silicon oxide (e.g., $SiO_2$, $SiO_x$, etc.), such as vitreous silica, a borosilicate glass, or an aluminosilicate glass. In some instances, the material of the dielectric body 352 is an oxide material such as magnesium oxide (e.g., MgO), aluminum oxide (e.g., $Al_2O_3$), silicon dioxide (e.g., $SiO_2$), titanium dioxide (e.g., $TiO_2$), zirconium dioxide, (e.g., $ZrO_2$), yttrium oxide (e.g., $Y_2O_3$), lanthanum oxide (e.g., $La_2O_3$), and so forth. The oxide material may be non-stoichiometric (e.g., $SiO_x$), and may also be a combination of one or more binary oxides (e.g., $Y:ZrO_2$, $LaAlO_3$, etc.). In certain variations, the combination may correspond to $BaLn_2Ti_4O_{12}$ where Ln refers to one or more elements from the lanthanide group of the periodic table of elements. In other instances, the material of the dielectric body 352 is a non-oxide material such as silicon (Si), diamond (C), gallium nitride (GaN), calcium fluoride (CaF), and so forth.

The dielectric body 352 includes an array of cavities 354 ordered periodically to define a photonic crystal structure 356 in the dielectric body 352 (e.g., the photonic crystal structure 356 is formed of dielectric material and includes the array of cavities 354). The array of cavities 354 may extend either partially or completely through the dielectric body 352. For example, the array of cavities 354 may be an array of blind holes, or as shown in FIG. 3B, an array of through-holes. The array of cavities 354 may also be partitioned into portions extending partially or completely through the dielectric body 352. For example, the array of cavities 354 may include a first portion extending partially through the dielectric body 352 (e.g., blind holes) and a second portion extending completely through the dielectric body 352 (e.g., through-holes). Although FIG. 3B depicts the array of cavities 354 as being an array of circular through-holes, other shapes are possible for the array of cavities 354 (e.g., hexagonal, oblong, etc.). In some variations, each of the array of cavities 354 has a maximum dimension in a range from 0.5 millimeters to 10 millimeters. The maximum dimension may be the same for each cavity. In some variations, the array of cavities 354 has a periodic spacing in a range from 0.9 millimeters to 15 millimeters. In some variations, the dielectric body 352 is a plate having a thickness in a range from 0.5 millimeters to 10 millimeters.

The dielectric body 352 also includes a region 358 in the array of cavities 354 defining a defect in the photonic crystal structure 356. In many variations, the region 358 is a solid region in the array of cavities 354 defined by an absence of cavities. The absence of cavities may correspond to the defect in the photonic crystal structure 356. For example, the defect may be a row or column of "filled" cavities. However, other patterns of "filled" cavities are possible. In some variations, such as shown in FIG. 3B, the region 358 may be disposed in a center of the dielectric body 352. The dielectric body 352 additionally includes an elongated slot 360 through the region 358 extending from a slot opening 362 in a surface 364 of the dielectric body 352 at least partially through the dielectric body 352. The elongated slot 360 may be part of the photonic crystal structure 356. In some variations, such as shown in FIG. 3B, the elongated slot 360 is disposed in a center of the region and aligned along a longitudinal axis of the dielectric body 352. It will be appreciated that, during operation of the example photonic crystal receiver 350, the array of cavities and the elongated slot 360 may function in tandem as a waveguide for the RF electromagnetic radiation.

In some implementations, the photonic crystal structure 356 defines a photonic band gap for the example photonic crystal receiver 350. For example, the photonic crystal structure 356 may define a photonic band gap associated with a transverse magnetic (TM) mode of the RF electromagnetic radiation. In another example, the photonic crystal structure 356 may define a photonic band gap associated with a transverse electric (TE) mode of the RF electromagnetic radiation. Combinations of TM and TE modes for the RF electromagnetic radiation are also possible.

In some implementations, the photonic crystal structure 356 is configured to decrease a group velocity of a target RF electromagnetic radiation (e.g., a target RF electromagnetic radiation having a frequency in a range from 100 MHz-1 THz). Such configuration may involve selecting a size of one or more cavities in the array of cavities 354, selecting a spacing of one or more cavities in the array of cavities 354, selecting an ordering of the array of cavities 354, and/or selecting a thickness of the dielectric body 352. Other characteristics are possible (e.g., selecting the material of the dielectric body 352). In some cases, the configuration of the photonic crystal structure 356 may be determined through numerical modeling.

In some implementations, the photonic crystal structure 356 is configured to concentrate a target RF electromagnetic radiation in the elongated slot 360. The target RF electromagnetic radiation may have a frequency in a range from 100 MHz-1 THz. Such configuration may involve selecting a size of one or more cavities in the array of cavities 354, selecting a spacing of one or more cavities in the array of cavities 354, selecting an ordering of the array of cavities 354, and/or selecting a thickness of the dielectric body 352. Other characteristics are possible (e.g., selecting the material of the dielectric body 352). In some cases, the configuration of the photonic crystal structure 356 may be determined through numerical modeling.

In some implementations, the photonic crystal structure 356 may include a photonic crystal mirror configured to redirect (e.g., reflect) the target RF electromagnetic radiation. For example, the array of cavities 354 may include one or more offset cavities that are spatially offset from an ideal periodic position in the array 354. The one or more offset cavities may define the photonic crystal mirror. In some variations, the one or more offset cavities reside nearest an end of the elongated slot 360 and have respective spatial offsets away from the end of the elongated slot 360. In some variations, the one or more offset cavities reside nearest a side of the elongated slot 360 and have respective spatial offsets away from the side of the elongated slot 360.

The example photonic crystal receiver 350 may also include a vapor or a source of the vapor in the elongated slot 360. The vapor may include constituents such as a gas of alkali-metal atoms, a noble gas, a gas of diatomic halogen molecules, or a gas of organic molecules. For example, the vapor may include a gas of alkali-metal atoms (e.g., K, Rb, Cs, etc.), a noble gas (e.g., He, Ne, Ar, Kr, etc.), or both. In another example, the vapor may include a gas of diatomic halogen molecules (e.g., $F_2$, $Cl_2$, $Br_2$, etc.), a noble gas, or both. In yet another example, the vapor may include a gas of organic molecules (e.g., acetylene), a noble gas, or both. Other combinations for the vapor are possible, including other constituents. The source of the vapor may generate the vapor in response to an energetic stimulus, such as heat, exposure to ultraviolet radiation, irradiation by laser light, and so forth. For example, the vapor may correspond to a gas of alkali-metal atoms and the source of the vapor may correspond to an alkali-metal mass sufficiently cooled to be in a solid or liquid phase when disposed into the elongated slot 360.

The example photonic crystal receiver 350 may additionally include an optical window 366 covering the elongated slot 360 and having a window surface bonded to the surface 364 of the dielectric body 352 to form a seal about the slot opening 362. The optical window 366 may be bonded to the dielectric body 352 using a contact bond, an anodic bond, a glass frit bond, and so-forth. Such bonds may be formed using techniques described in the previously referenced U.S. Pat. No. 10,859,981 entitled "Vapor Cells Having One or More Optical Windows Bonded to a Dielectric Body." The optical window 366 may be formed of a material that is transparent to electromagnetic radiation (e.g., laser light) used to probe the vapor. For example, the optical window 366 may be transparent to infrared wavelengths of electromagnetic radiation (e.g., 700-5000 nm), visible wavelengths of electromagnetic radiation (e.g., 400-700 nm), or ultraviolet wavelengths of electromagnetic radiation (e.g., 10-400 nm). Moreover, the material of the optical windows 366 may be an insulating material having a high resistivity, e.g., $p>10^3$ $\Omega \cdot cm$, and may also correspond to a single crystal material, a polycrystalline material, or an amorphous (or glass) material. For example, the material of the optical window 366 may include silicon oxide (e.g., $SiO_2$, $SiO_x$, etc.), such as found within quartz, vitreous silica, or a borosilicate glass. In another example, the material of the optical window 366 may include aluminum oxide (e.g., $Al_2O_3$, $Al_xO_y$, etc.), such as found in sapphire or an aluminosilicate glass. In some instances, the material of the optical window 366 is an oxide material such as magnesium oxide (e.g., MgO), aluminum oxide (e.g., $Al_2O_3$), silicon dioxide (e.g., $SiO_2$), titanium dioxide (e.g., $TiO_2$), zirconium dioxide, (e.g., $ZrO_2$), yttrium oxide (e.g., $Y_2O_3$), lanthanum oxide (e.g., $La_2O_3$), and so forth. The oxide material may be non-stoichiometric (e.g., $SiO_x$), and may also be a combination of one or more binary oxides (e.g., $Y:ZrO_2$, $LaAlO_3$, $BaLn_2Ti_4O_{12}$, etc.). In other instances, the material of the optical window 366 is a non-oxide material such as diamond (C), calcium fluoride (CaF), and so forth.

In some implementations, the optical window 366 covers only the elongated slot 360 and the surface 364 of the dielectric body 352 immediately adjacent the elongated slot 360 (e.g., the region 358 or portion thereof). However, in some implementations, the optical window 366 also covers the surface 364 of the dielectric body 352 associated with the photonic crystal structure 356. In these implementations, such as shown in FIG. 3B, the surface 364 of the dielectric body 352 defines a cavity opening for each of the array of cavities 354. The optical window 366 may cover each of the cavity openings. Moreover, the window surface of the optical window 366 may form a seal about each of the cavity openings.

In implementations where the elongated slot 360 extends only partially through the dielectric body 352, a single optical window may be bonded to the dielectric body 352 to seal the vapor or source of the vapor in the elongated slot 360. However, in some implementations, the elongated slot 360 may extend through the dielectric body 352. In these implementations, two optical windows may be bonded to the dielectric body 352 to seal the vapor or source of the vapor in the elongated slot 360. For example, the surface 364 of the dielectric body 352 may be a first surface and the dielectric body 352 may include a second surface opposite the first surface. The elongated slot 360 may then extend through the dielectric body 352 from the first surface to the second surface. In this case, the slot opening 362 may be a first slot opening and the second surface of the dielectric body 352 may define a second slot opening of the elongated slot 360. The example photonic crystal receiver 350 may include a second optical window 368 covering the second slot opening, as shown in FIG. 3B. The second optical window 368 has a second window surface bonded to the second surface of the dielectric body 352 to form a seal about the second slot opening.

In some implementations, the second optical window 368 covers only the elongated slot 360 and the second surface of the dielectric body 352 immediately adjacent the elongated slot 360 (e.g., the region 358 or portion thereof). However, in some implementations, the second optical window 368 also covers the second surface of the dielectric body 352 associated with the photonic crystal structure 356. For example, the first and second surfaces of the dielectric body 352 may define, respectively, first and second cavity openings for each of the array of cavities 354. In this case, the array of cavities 354 extends through the dielectric body 352 from the first surface to the second surface. The second optical window 368 may then cover, respectively, each of the second cavity openings, as shown in FIG. 3B. Moreover, the second window surface may form a seal about each of the second cavity openings.

In some implementations, the dielectric body 352 includes an antenna structure 370 extending from an end 372 of the dielectric body 352 and aligned with the elongated slot 360. For example, the antenna structure 370 may be a protrusion extending from the end 372 of the dielectric body 352 and terminating in a taper. The antenna structure 370 may be configured to couple to a beam of target RF electromagnetic radiation (e.g., a beam of target RF electromagnetic radiation having a frequency in a range from 100 MHz-1 THz). Such configuration may involve selecting a length of the antenna structure 370, which may be determined by numerical simulation for the target RF electromagnetic radiation. Other dimensions may also be involved, including ratios of dimensions, e.g., thicknesses, widths, length-to-width ratios, length-to-thickness ratios, and so forth. The configuration of the antenna structure 370 for coupling to the beam of target RF electromagnetic radiation may also involve selecting a shape of the antenna structure 370 or a degree of curvature of the antenna structure 370. The shape, the degree of curvature, or both, may also be determined by numerical simulation.

In some variations, the antenna structure 370 includes a polarizer, which may be integral to the antenna structure 370. For example, the antenna structure 370 may include a narrow portion aligned with the elongated slot 360. The antenna structure 370 may also include an array of co-planar segments extending outward from the narrow portion and having a periodic spacing therealong. The array of co-planar segments is configured to filter (or select) a polarization of the target RF electromagnetic radiation.

In some variations, the antenna structure 370 includes one or more channels 374 defining a taper 376 internal to the antenna structure 370. The taper 376 is configured to couple electromagnetic radiation received by the antenna structure 370, e.g., the beam of target RF electromagnetic radiation, to the waveguide of the example photonic crystal receiver 350 (e.g., the elongated slot 360). To do so, the taper 376 may have an apex 378 aligned with the elongated slot 360. For example, the antenna structure 370 may be a protrusion extending from the end 372 of the dielectric body 352. In this case, the antenna structure 370 may include a V-shaped channel defining a taper internal to the protrusion. The taper may have a tip (or apex) offset from an end of the elongated slot 360 aligned therewith. In an alternate case, such as shown in FIG. 3B, the antenna structure 370 may include a Y-shaped channel in the protrusion that includes a base portion 374a and two branch portions 374b. The base portion 374a is aligned with the elongated slot 360 and terminates in an end offset from an end of the elongated slot 360. The two branch portions 374b split from the base portion 374a to define a taper internal to the protrusion (e.g., taper 376). Other configurations are possible for the taper 376.

In operation, the example photonic crystal receiver 350 receives RF electromagnetic radiation at the antenna structure 370 of the dielectric body 352. In some instances, the example receiver 350 couples the received RF electromagnetic radiation to the elongated slot 360 using the taper 376 internal to the antenna structure. The example photonic crystal receiver 350 also interacts the received RF electromagnetic radiation with the photonic crystal structure 356. In such interaction, the photonic crystal structure 356 may decrease a group velocity of the received RF electromagnetic radiation along a direction parallel to the elongated slot 360 (e.g., an axis of the elongated slot 360). The photonic crystal structure 356 may also concentrate the received RF electromagnetic radiation in the elongated slot 360. The example photonic crystal receiver 350 additionally passes input optical signals through the vapor in the elongated slot 360 to generate one or more output optical signals. The input optical signals may be produced by one or more input lasers (e.g., a probe laser, a coupling laser, etc.). In some variations, the example photonic crystal receiver 350 may be used with a dish to improve a sensitivity of the example receiver 150 to RF electromagnetic radiation.

In some implementations, passing the input optical signals includes propagating the input optical signals along an optical pathway defined by the elongated slot 360. In some implementations, passing the input optical signals includes reflecting the input optical signals off a mirror disposed at an end of the elongated slot. For example, the example receiver 350 may include a mirror 380 disposed at an end of the elongated slot 360. The mirror 380 may be angled relative to the optical pathway (e.g., angled at 45°), or as shown in FIG. 3B, be perpendicular to the optical pathway. Such orientations may allow the mirror 380 to direct light into the elongated slot 360, direct light along the elongated slot 360 through the vapor, and/or direct light out of the elongated slot 360.

In some implementations, the example photonic crystal receiver 350 functions as a Rydberg atom-based radar receiver with an electric field sensitivity that is enhanced by a significant factor (e.g., a factor of approximate 1000, or another factor) compared to a bare vapor cell. The example photonic crystal receiver 350 may have a sensitivity at least equivalent to a conventional receiver and may be able to reach the thermal noise floor. Methods to fabricate the photonic crystal receiver include machining silicon and glass with lasers, thereby allowing the formation of microstructures in these materials with μm precision and less than 10 μm feature sizes. Such precision and feature scales are well suited for photonic crystal frames that interact with a radio frequency field, since the wavelength of the radio frequency field is much greater than 10 μm. The high accuracy of the machining process in relation to the wavelength of the target radiation may also reduce loss in the device.

Now referring back to FIGS. 2A and 2B, the communication system 200 may be configured to include a one-way communication channel. For example, the first station 202 may include a photonic crystal maser (e.g., the photonic crystal maser 202a) and the second station 204 may include a receiver (e.g., a metallic antenna or the photonic crystal receiver 204b). However, one or both of the first and second stations 202, 204 may include a transceiver having two main components. In these variations, the first component is a receiver device (Rx component) and the second component is a transmitter device based on a photonic crystal maser (Tx component). For example, the transceiver can include one or more photonic crystal masers and one or more photonic crystal receivers. The transceiver can allow the first and second stations 202, 204 of the communication system 200 to establish a two-way communication channel.

It can be advantageous in communications systems, and sometimes in radar systems, to separate the receiving and transmitting components. This separation can mitigate signal crosstalk between the receiving and transmitting components, which are typically formed of metal, and thus allow higher data rates than can otherwise be achieved. The separation may allow each component to be optimized for its specific operation. However, due to all-dielectric construction, the communication system 200 can combine the photonic crystal maser and the photonic crystal receiver in close proximity, but while allowing greater performance than would achieved with traditional metal receiving an transmitting components. Moreover, the photonic crystal maser generates a directional output, like a laser, which can allow the communication system 200 to operate as a point-to-point communication system. In variations where the transceiver of the stations includes a photonic crystal maser and a photonic crystal receiver, these components can use the same laser systems to generate or receive radio-frequency signals using atoms, partially in Rydberg states. By sharing a laser subsystem, the stations may be more compact. Other advantages are possible.

The photonic receiver is based on the idea of increasing the interaction time and local field intensity in the region where the vapor is. The photonic crystal receiver includes a photonic crystal structure that couples an incident RF electromagnetic radiation into a waveguide. The waveguide includes a slot to concentrate the incident RF electromagnetic radiation and is configured to slow the incident RF electromagnetic radiation to increase the interaction time with the vapor. In some instances, the field of the incident RF electromagnetic radiation can be enhanced about a thousandfold. This enhancement can increase the sensitivity of the photonic crystal receiver to the thermal noise floor. Two-photon or three-photon preparation and readout methods can be implemented in a collinear geometry. However, higher order photon processes are possible. In some variations a three-photon process in used. The three-photon process can increase the number of atoms or molecules in the vapor that interact with the laser fields, but requires three lasers, instead of two. For this reason, some variations may rely on a photonic crystal receiver that uses a two-photon process, such as one used in Rydberg atom-based sensing. Multi-photon processes for photonic crystal receivers are described further in U.S. Pat. No. 11,137,432 entitled "Photonic Crystal Receivers," the disclosure of which, is incorporated herein by reference in its entirety.

Similar to the photonic crystal receiver, the photonic crystal maser includes a photonic crystal structure and elongated vapor cell therein. Rydberg atoms in highly reflective cavities (e.g., a vapor of atoms) can generate masing at extremely low threshold, even with very low atomic vapor pressures. Moreover, atoms or molecules in traveling wave waveguides can also be made to exhibit masing. The photonic crystal maser may manipulate the field of a target RF electromagnetic radiation to increase the interaction with the vapor, such as through the waveguide defined by the photonic crystal structure (e.g., an array of cavities and an elongated slot therein). As such, the vapor experiences an altered electromagnetic environment that favors them emitting into a resonance mode of the waveguide. If the enhanced emission is large enough, the vapor will reach masing threshold and the photonic crystal maser will emit radiation coherently. If the enhancement is lower, the photonic crystal maser may approach an operational regime of the photon crystal receiver. For example, masing can occur if the emission rate of the vapor on a masing transition, A, times the quality factor of the waveguide or cavity, Q, divided by the masing frequency, w, is greater than 1 (i.e., AQ/w>1). If AQ/w is less than one, the photonic crystal maser may operate as a photonic crystal receiver. The operational characteristics of photonic crystal masers are described further in U.S. patent application Ser. No. 17/514,819 entitled "Photonic Crystal Masers," the disclosure of which, is incorporated herein by reference in its entirety.

To ensure operation as a maser, the photonic crystal structure of the photonic crystal maser may be configured, for example, to increase Q. In some variations, the photonic crystal structure is configured to include photonic crystal mirrors. These mirrors may allow reflectivities up to 98%, which is sufficient to achieve masing because of the low threshold. Moreover, output powers of above 10 nanowatts can be achieved. These powers are sufficient for a terrestrial point-to-point communication system but small for a space-born system. To increase the power, the photonic crystal maser can be amplified using a vapor cell pumped to the same state as the photonic crystal maser or another waveguide structure with atoms pumped to the same state, which can be coupled efficiently by waveguide couplers. In many instances, output powers of milli-Watts are possible.

In some implementations, the communication system 200 is configured as a point-to-point communication system. The range of the point-to-point communication system may be affected by a couple of factors. For example, the beam of target RF electromagnetic radiation may be attenuated along its path. The beam of target RF electromagnetic radiation may also be spread (or become less focused) along the path. However, the photonic crystal receiver has a sufficient sensitivity that attenuation of the beam of RF electromagnetic radiation does not disrupt communication. For example, when configured as a Rydberg atom receiver, the photonic crystal receiver can detect signals at about −110 dBm at 20 MHz bandwidth. By comparison, attenuation to the horizon—about 30 km generously for most applications—is less than 3 dBm. Moreover, an unamplified photonic crystal maser operating at −60 dBm still has plenty of link margin to operate with a large signal-to-noise ratio. A similar analysis applies to transmission from a satellite through the atmosphere since most of the atmosphere is contained within the stratosphere which ends at about 30 km.

Spread of the beam of target RF electromagnetic radiation, however, can have a stronger influence on the stability of a communication channel. For example, if the photonic crystal produces about 10 nanowatt of power at 80 GHz and the resulting beam is collimated to a diameter of 75 cm, then the angular spread of the beam is about 0.5 degrees. At a distance of 30 km, the beam diameter has increased to about 100 m, based on optics alone (e.g., Gaussian beam assuming 86% of the power within the spot size). Assuming an entrance aperture for the photonic crystal receiver that is similar, the signal level at the photonic crystal receiver can be estimated to be about −93 dBm, which is 17 dBm above the noise level of the receiver, assuming a 20 MHz bandwidth.

In some variations, the output of the photonic crystal maser can be increased (e.g., to about 1 milliwatt) to counteract the negative effects of beam spread. For example, at 1 milliwatt of output power, the aperture of the station can be significantly decreased depending on the application. If the station was placed in low earth orbit (LEO) at about 2000 km (e.g., the station is a satellite), the spot size on earth as transmitted by the station would be 6 km in size. To obtain the same signal margin would require a power of about 100 µW, significantly less than current RF systems in orbit. However, a 2000 km distance is the outer limit of LEO. Most satellites in LEO are below 1000 km, with some as low as 160 km. At these distances, communication from the station may occur reliably without amplification of the photonic crystal maser. In a geosynchronous orbit (GEO) at about 35,000 km tens of milliwatts are required, but in this case, the photonic crystal maser can be amplified. It will be appreciated that the larger beam sizes, when compared to laser communications, may also reduce the accuracy requirements on the tracking subsystem, while still retaining many of the advantages of point-to-point communications.

Figure 4:
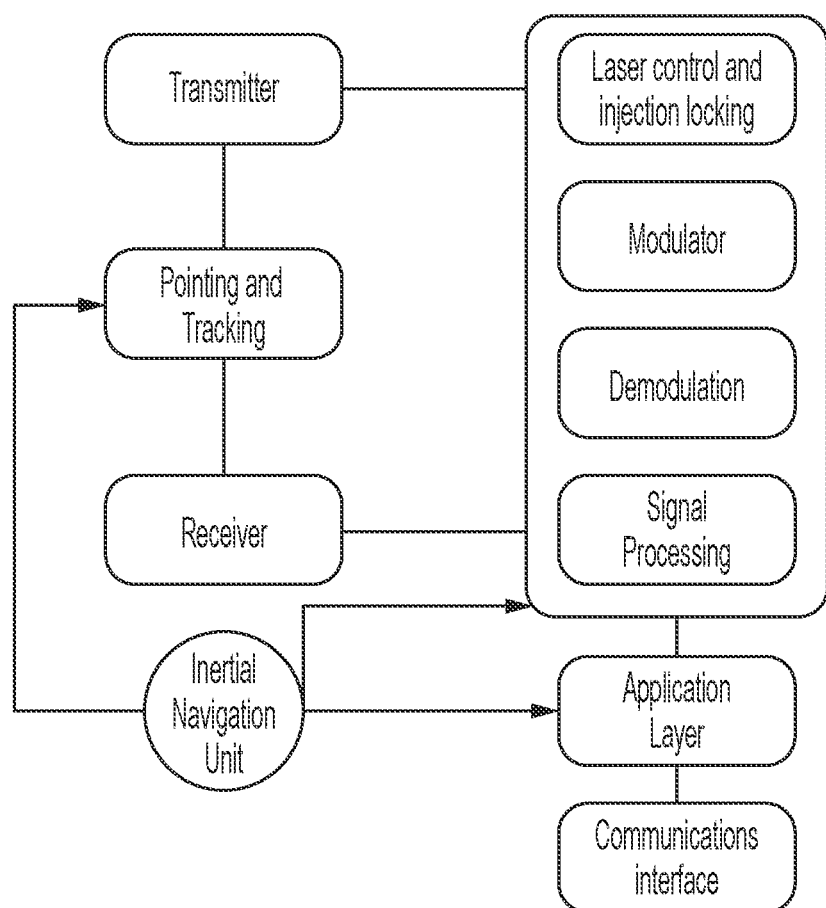
FIG. 4 is a block diagram of an example station of a point-to-point communication system.

Now referring to FIG. 4, a block diagram is presented of an example station of a point-to-point communication system. The example station may be analogous to the first and second stations 202, 204 described in relation to FIGS. 2A and 2B. The transmitter is a photonic crystal maser and the receiver may be a conventional receiver (e.g., a metallic antenna) or a photonic crystal receiver. In variations where the receiver is a photonic crystal receiver, the transmitter and receiver can be run from the same or different laser subsystems. The modulation of the maser signal and the demodulation of the received signal can be done partially in a physical layer and partially in an application layer. For example, heterodyne detection can be done in the receiver itself by beating part of the maser signal with the received signal. Once the received signal is converted to an electronic signal by a detector using the light transmitted through the receiver, further processing can done digitally, such as by a data processing subsystem.

In some implementations, the transmitter is photonic crystal maser (e.g., a Rydberg atom maser). The photonic crystal maser can be modulated in amplitude by switching the pump lasers on and off. Phase and frequency modulation can be accomplished by injection locking the photonic crystal maser to a stabilized RF source (e.g., a reference RF oscillator of a reference RF subsystem). The injection locking can occur by using an output coupler on one side of the photonic crystal maser, which in some variations, includes inserting the output coupler into an antenna or waveguide. Only a small amount of power may be necessary to injection lock the photonic crystal. The injection locking signal only needs to be large enough to bias the masing to the phase and frequency of the injected wave. Phase or frequency modulation of the injection locking wave can phase or frequency modulate the output of the photonic crystal maser. The photonic crystal maser can be coherent with a photonic crystal maser at another station if the two are synchronized. Synchronization can take place by locking the injected RF wave to synchronized clocks which, in some instances, are part of an inertial navigation unit.

In some implementations, the receiver is a photonic crystal receiver (e.g., a Rydberg atom receiver). The antenna structure of the photonic crystal receiver can implement a polarizer so that it is sensitive to a polarization of an input (or incident) beam of RF electromagnetic radiation. Two photonic crystal receivers can be used in order to detect polarization modulated signals. Moreover, multiple photonic crystal receivers can be grouped together to receive input beams at multiple frequencies and polarizations. The photonic crystal receiver can include a dish to increase an intensity of an incident beam of RF electromagnetic radiation. The photonic crystal receiver can be pointed using a tracking subsystem (e.g., one that includes a 3-axis motor driven mechanical drive and gimbled mount). Moreover, fine adjustments can be made with 3-axis control of optical elements such as mirrors. The vapor in the vapor cell of the photonic crystal receiver can be prepared and readout optically (e.g., by a probe laser, a coupling laser, etc.). The optical signals may be transported to the vapor cell via fiber optic cable. Broad-band Rydberg atom receivers with less sensitivity are also possible to use for the example station as well as arrays of vapor cells. Arrays of vapor cells can be advantageous as they present a larger target, which facilitates pointing and tracking.

In some variations, the example station may include a reference component, such as an antenna or a Rydberg atom maser for determining phase and frequency. The reference component may generate a reference RF electromagnetic radiation to superimpose onto an input beam of RF electromagnetic radiation (e.g., a beam incident on the photonic crystal receiver). The determined phase and frequency may be used, for example, via heterodyne measurements using the transmit maser or the injection seeding source. A Rydberg atom maser can also be used as an amplifier for the incident beam or can be used to provide a reference signal. A Rydberg atom maser is also dielectric and can be prepared or pumped by the same laser types as used for readout and preparation of the photonic crystal receiver. Because the photonic crystal receiver can be self-calibrated, absolute amplitude information can be used by the example station to improve pointing stability.

In some implementations, the example station includes a laser subsystem having input lasers to generate preparation and readout signals. The laser subsystem may also include laser stabilization devices (e.g., laser locking and tuning references) and electronics for switching the laser frequencies (for multiple frequency systems using a single laser source). The example station also includes an optical subsystem configured for signal acquisition, such as via photodetectors. The example station may additionally include low-level electronics needed to control the laser and optical subsystems. For an example station with multiple photonic crystal receivers, the example may include multiple input lasers or switches so that a reduced number of input lasers is able to drive the example station. The electronics also includes laser intensity stabilization units and the necessary actuators to frequency stabilize the input laser(s) to references such as a Fabry-Perot cavity, reference vapor cell, or a wavemeter. Also, the example station may include a reference RF subsystem having a reference RF oscillator (e.g., a microwave oscillator) for injection locking the photonic crystal maser. This reference RF oscillator may be referenced to the inertial navigation clock or timing subsystem (e.g., GPS). In some variations, the reference RF oscillator is coupled into the photonic crystal maser via a waveguide or an antenna.

In some implementations, the example station includes an inertial navigation unit. A clock signal can be used to synchronize time and phase for signal detection, as well as serve as a synchronization signal for an inertial navigation unit for positioning the station. The clock signal can come from a GPS signal if satellite communications are available (operation in a non-GPS denied region). However, in some variations, the example station includes a backup clock such as an atomic clock (e.g., based on Cs or Rb), a maser, or a quartz oscillator. A chip scale atomic clock can be used. These devices can be combined with GPS for resynchronizing signals, e.g., the clock can be GPS steered. A master clock can be located in another remote location and its synching signal transmitted to the example station, via a communications channel. Synchronization signals can be sent between the stations to synchronize the clocks, such as shown in FIGS. 1 and 2A. The clock signal can also be used to synchronize the photonic crystal masers at each station by synchronizing the injection seed frequency and phase at each station.

The inertial navigation unit may be located with the example station to determine its position. In some instances, the inertial navigation unit and GPS can be used for crude pointing to establish the link between the Tx and Rx components at each station in the point-to-point communication system. The inertial navigation unit may include the clock used for timing (or several clocks and GPS), accelerometers, GPS receiver, and gyroscopes, or some combination thereof. In some variations, the example station maintains communication with a satellite. In these variations, GPS positioning may be used. If satellite communications are denied for periods of time, then the inertial navigation unit can track the position in cases of movement. The inertial navigation unit can then reinitialize itself when GPS communications are restored. It is possible that communications with another station can be used to update the clock at the other station by sending timing information. It is also possible that RF ranging can be used between stations of the point-to-point communication system to obtain position, since the photonic crystal receivers can be self-calibrated. The latter point is particularly useful if one of the base stations is operating in a GPS denied environment and the other is not (or some stations of the point-to-point communications system are GPS denied and others are not).

In some implementations, the example station includes a tracking subsystem. The tracking subsystem is operable to point and track Rx and Tx componentry so that the Tx on one station is aligned with the Rx on the other station. In cases where satellite communications are involved, the tracking subsystem may handle multiple layers of signal acquisition. The tracking subsystem may include actuators for controlling gimballed mounts that point the devices (e.g., transmitters, receivers, transceivers) or control an orientation of mirrors. For example, course actuators and control systems may have a wide field of view so that the input beam of RF electromagnetic radiation can be captured more easily with subsequent refinement until the communications channel is locked at the level of the Rx and Tx. GPS positioning along with the inertial navigation unit can be used at the coarsest level of the system. Subsequently, an RF beacon with wider field of view can be used. An RF antenna or an expanded maser beam can be used to establish the communications link. Pointing can also be adjusted using the inertial navigation system to anticipate the position of moving targets. Active locking of the communications channel can be used once the channel has been established.

In some implementations, the example station includes modulation electronics. The modulation electronics may serve to control properties of a beam of RF electromagnetic radiation (or Tx signal) generated by the photonic crystal maser (e.g., an outgoing beam). Modulation of the Tx signal can be accomplished in several different ways. For example, to modulate the Tx signal in amplitude, the pump lasers can be turned on and off. Communications schemes such as pulse position modulation and on-off keying can be used. Phase and frequency modulation can be accomplished by injection seeding the maser with another RF wave. The injection seed biases the maser to mase in-phase and at the frequency of the seed. If the seed is phase locked to the clock at two or more stations of the point-to-point communication system, then coherent detection strategies can be used. These schemes of encoding messages allow methods such as phase shift keying, differential phase shift keying, frequency shift keying and polarization shift keying. Polarization shift keying is also possible, but requires two masers emitting with different, respective polarizations.

In some implementations, the example station includes demodulation electronics. The demodulation electronics may serve to determine time varying properties of an input beam of RF electromagnetic radiation (or Rx signal) received by the photonic crystal receiver (e.g., an incoming beam). In Rydberg atom-based sensing, the incident Rx signal is optically read-out. The resulting optical signal can be detected, for example, on a square law detector. As a consequence, amplitude detection is straightforward, but phase and frequency detection may involve a reference RF electromagnetic radiation (e.g., generated by the reference component) to superpose with the incoming signal. The interference of the reference RF electromagnetic radiation and an input beam of RF electromagnetic radiation can be used to determine the phase and frequency of the incident field relative to the reference field. These methods can be realized using 'so called' homodyne or heterodyne detection of signals. In some variations, demodulation of the Rx signal can be accomplished by using part, or all, of a signal from an injection locked photonic crystal maser. The signal may provide, in part or whole, the reference RF electromagnetic radiation. It is also possible to generate a signal referenced to the system clock from an antenna and use it as the reference. If the receiver is a traditional antenna (but RF coupled to the injection-locked photonic crystal maser) then fast detectors and spectrum analyzers can be used to obtain the phase and frequency relative to the clock.

Figure 7:
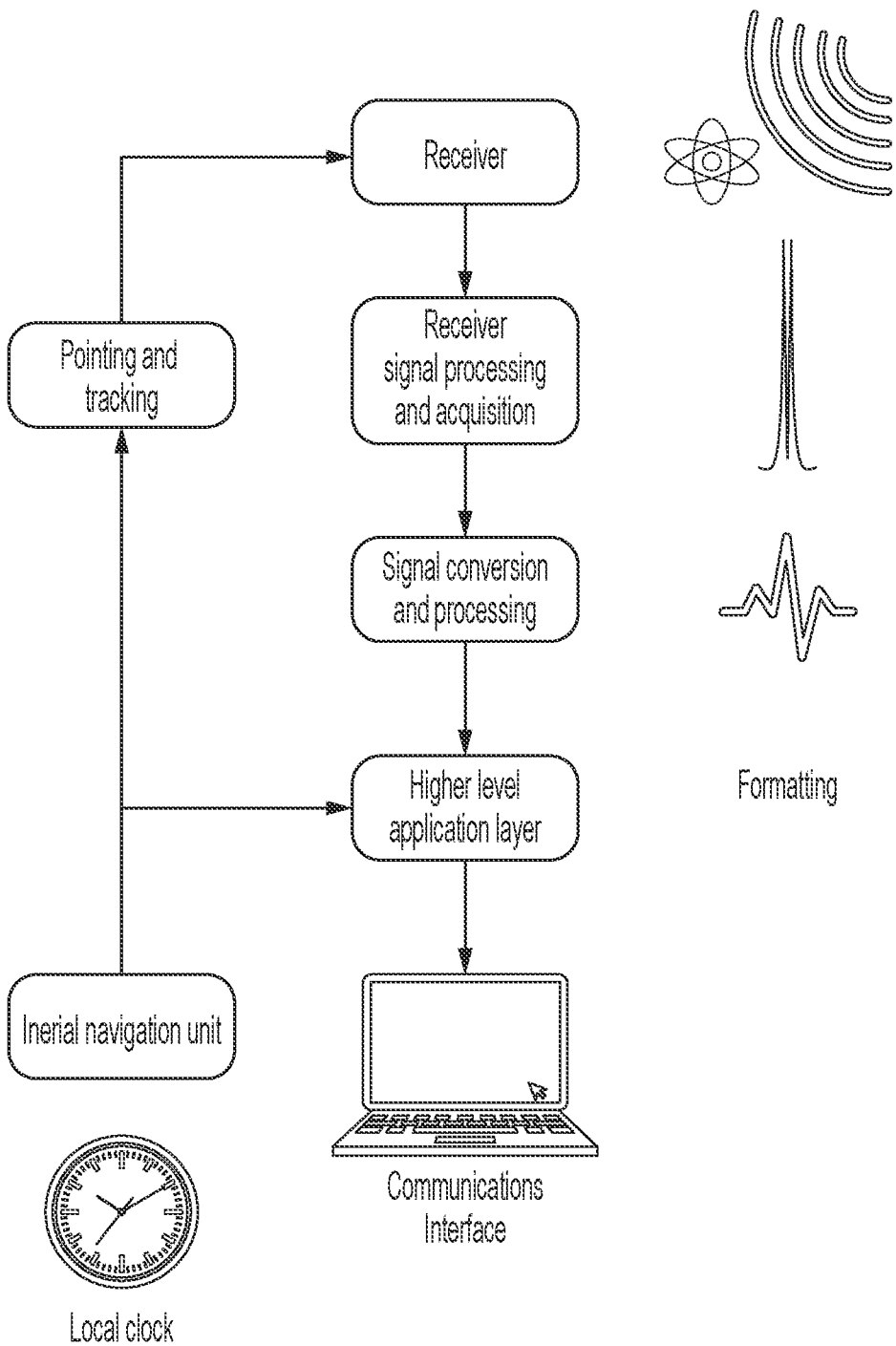
FIG. 7 is a schematic diagram of an example process for converting an input beam of RF electromagnetic radiation into a time series of data.

In some implementations, the example station includes signal processing electronics. The signal processing electronics may be in communication with the laser subsystem to control properties of the optical signals provided the pump laser(s) to the photonic crystal maser. The signal processing electronics may also control properties of the input optical signals provided by the input lasers for the photonic crystal receiver. The signal processing electronics may operate cooperatively with the optical subsystem to generating spectroscopic data. For example, the signal processing electronics and optical subsystem may take the received optical signal (or output optical signal) and eliminate noise from the signal before generating the spectroscopic data. The spectroscopic data may then be sent to a data processing subsystem for further processing (e.g., a formatting operation as shown in FIG. 7). The signal processing subsystem and optical subsystem may utilize methods such as matched filtering to extract pulses or other communications waveforms. They can also take beat signals from the demodulation electronics and convert the beat signals into frequency and phase data. In some instances, the signal processing electronics include an FPGA circuit designed for a specific signal protocol. The FPGA can be reprogrammed on-the-fly if the signal protocol changes, e.g., phase shift keying to amplitude modulation.

Figure 5:
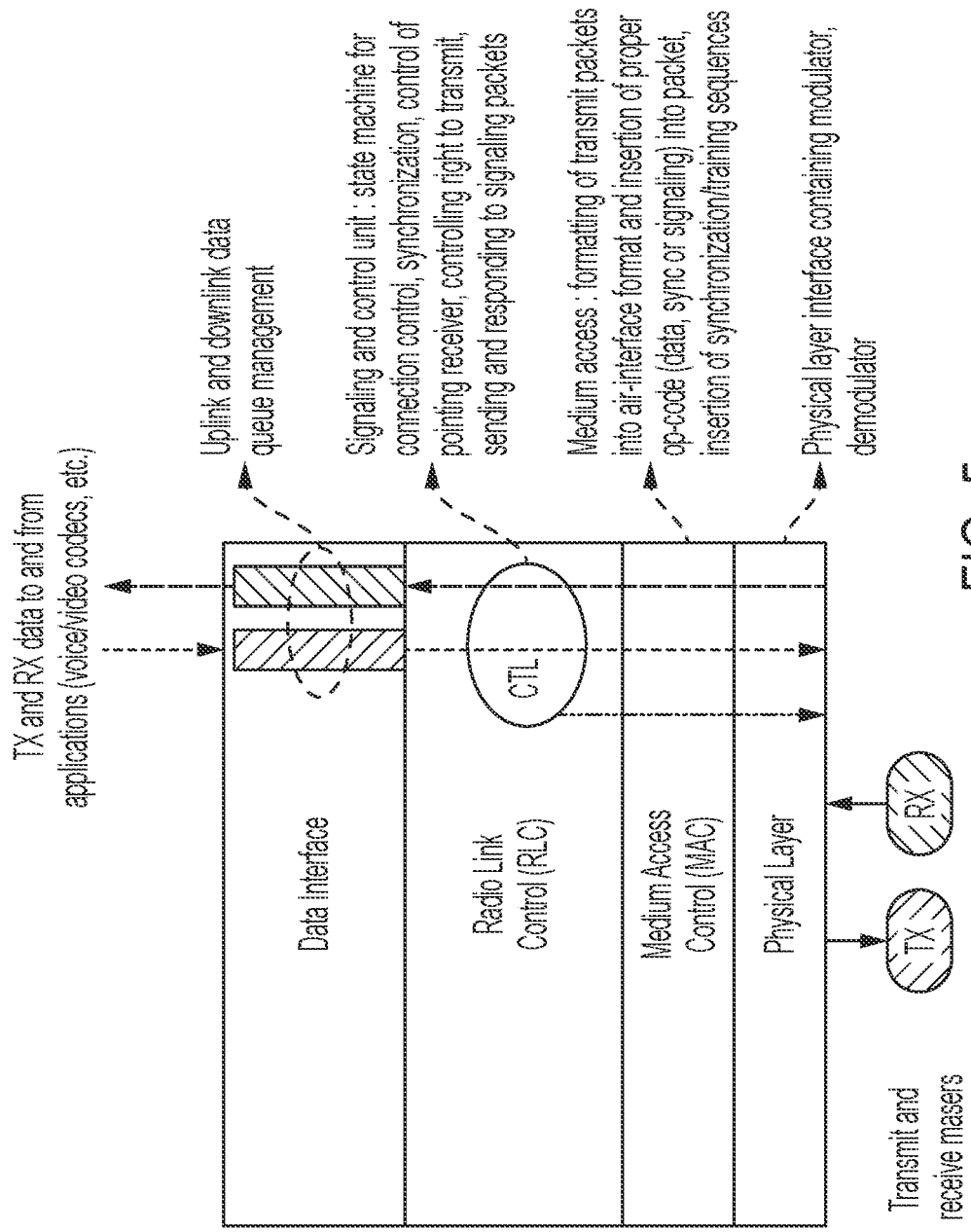
FIG. 5 is a schematic diagram of an example application layer utilized by a data processing subsystem to handle Rx data flows to and Tx data flows from the example station of FIG. 4.

In some implementations, the example station includes a data processing subsystem. The data processing subsystem may operate to establish an application layer that processes the spectrum acquired by the optical subsystem to get an intensity, phase or frequency (or combination thereof) and turn it into a time series of data. FIG. 5 presents a schematic diagram of an example application layer utilized by a data processing subsystem to handle Rx data flows to and Tx data flows from the example station of FIG. 4. The time series of data may be correlated to the timing system in order to receive information. To transmit information, the data processing subsystem packages the information and prepares it for the modulation electronics. The modulation electronics modulates an output of the photonic crystal maser (e.g., the beam of RF electromagnetic radiation) to transmit the information. The data processing subsystem also takes the amplitude, frequency and phase information from the incoming signal, packages it and prepares it for a communication interface. Likewise, the data processing subsystem takes signals generated by the communications interface and prepares them for the modulation electronics in order to send them out via the photonic crystal maser.

Figure 6:
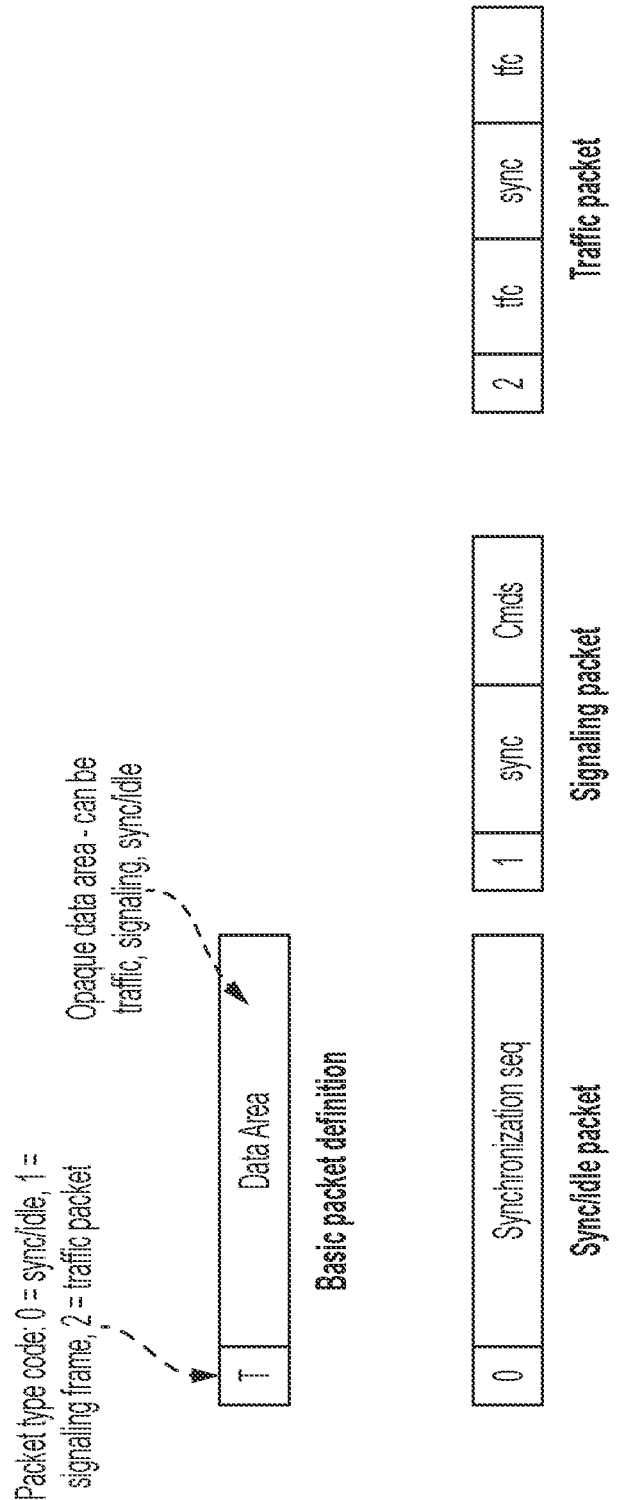
FIG. 6 is a schematic diagram of an example message format that includes example synchronization, signal, and traffic packets.

In some variations, the data processing subsystem consists of a system on a chip (SoC). The SoC can be a CPU combined with a field programmable gate array (FPGA). The data processing subsystem can manipulate the time series of data before it is sent to the communications interface. On-off keying and pulse position modulation are two potential intensity modulation schemes that can be used. Phase shift keying, differential phase shift keying, frequency shift keying and polarization shift keying can all be used as well. These latter schemes can be implemented if the photonic crystal maser is injection seeded with a reference RF signal (or electromagnetic radiation). The injection locking fixes the phase and frequency and links it to a stable clock signal. To use polarization shift keying two orthogonal photonic crystal masers can be used with different polarizations, along with two receivers with high polarization sensitivity (e.g., two orthogonal photonic crystal receivers). The phase and frequency (generally phase or angle) can be determined by heterodyned measurements that use the synchronized maser at each transceiver. FIG. 6 presents a schematic diagram of an example message format that includes example synchronization, signal, and traffic packets. The example message format may be generated by the data processing subsystem before it is passed onto the communication interface, or alternatively, received by the data processing subsystem from the communication interface.

In some implementations, the example station includes a communications interface. The communications interface exchanges data with the data processing subsystem. The data may be the result of computer processes run in the application layer. The communications interface also can include a SoC, or series of specialized SoCs. The configuration of the SoC depends on the number of communications channels and their nature. The communications interface can be connected to the data processing subsystem via wired, wireless, or fiber optic communication means as well as some combination of the these. The protocols for the communications interface may be specific to the nature of the channels, the data rates required, and the timings required. Codec, voice, and video, for example, can be used. The communications interface can also be used to tune or do maintenance on the example station as well as enter and extract data. In some instances, there can be a computer along with a transducer from voice to digital, for example. Data can be entered via a keyboard, voice, or other such medium. Data storage may also associated with the communications interface.

Now referring to FIG. 7, a schematic diagram is presented of an example process for converting an input beam of RF electromagnetic radiation into a time series of data. The input beam of RF electromagnetic radiation is received by a photonic crystal receiver of the example station. In particular, the schematic diagram shows how the output optical signal from the vapor of the photonic crystal receiver is processed and converted into a time series of data that can represent voice data, codec data, video data, and so forth. The application layer of the data processing subsystem may communicate with the inertial navigation unit of the tracking system to schedule and determine if a communication channel is open. These subsystems may also work together to maintain the communication channel, and in doing so, may work through the inertial navigation unit. The timing electronics of a local clock may provide a clock signal for the example station. The clock signal can be used for formatting the synchronization signal for the example stations and for and queue management.

In some implementations, a communication system includes first and second stations having respective transceivers that include multiple photonic crystal masers and receivers. The communication system may be a point-to-point communication system. Moreover, the photonic crystal masers may be analogous to the photonic crystal masers 202a, 204a described in relation to FIGS. 2A and 2B and the example photonic crystal maser 300 described in relation to FIG. 3A. The photonic crystal receivers may be analogous to the photonic crystal receivers 202b, 204b described in relation to FIGS. 2A and 2B and the example photonic crystal receiver 350 described in relation to FIG. 3B.

Each station of the communication system includes a transceiver having one or more photonic crystal masers and one or more photonic crystal receivers. In particular, each photonic crystal maser is configured to generate an output beam of RF electromagnetic radiation in response to receiving a first input optical signal. The output beam represents information to be transmitted to another station of the communication system. Moreover, each photonic crystal receiver is configured to generate an output optical signal in response to receiving an input beam of RF electromagnetic radiation and a second input optical signal. The input beam represents information received from another station of the communication system. In some variations, the one or more photonic crystal masers include a pair of photonic crystal masers that are configured to produce respective output beams of RF electromagnetic radiation that have polarizations orthogonal to each other. In some variations, the one or more photonic crystal receivers include a pair of photonic crystal receivers that are configured to process respective input beams of RF electromagnetic at polarizations that are orthogonal to each other.

The first and second stations each also include a control subsystem, which may serve in part as a laser control subsystem. The control subsystem has one or more lasers optically coupled to the one or more photonic crystal masers and the one or more photonic crystal receivers. The one or more lasers are configured to generate the first and second input optical signals. The control subsystem also has modulation electronics in communication with the one or more lasers. The modulation electronics are configured to control one or more properties of the first input optical signal. The one or more properties of the first input optical signal include an intensity, a frequency, or a phase of the first input optical signal. The control subsystem additionally includes demodulation electronics in communication with the one or more lasers. The demodulation electronics are configured to control one or more properties of the second input optical signal. The one or more properties of the second input optical signal comprising an intensity, a frequency, or a phase of the second input optical signal.

In some implementations, first and second stations each additionally include a tracking subsystem configured to control an orientation of the transceiver, thereby pointing the one or more photonic crystal masers and the one or more photonic crystal receivers at a target location. In some variations, the first station is disposed at the target location of the second station and the second station is disposed at the target location of the first station. In some variations, the communication station includes a relay station disposed at a relay location and configured to receive and transmit beams of target RF electromagnetic radiation. The relay location serves as the target location for the tracking subsystems of one or both of the first and second stations.

In some implementations, the first and second communication systems include a navigation subsystem in communication with the control subsystem and the tracking subsystem. The navigation subsystem may include positioning electronics configured to determine a position of the first or second station and timing electronics configured to set local reference parameters for the first or second station. One or both of the position and timing electronics may define part or all of an inertial navigation unit. The local reference parameters may include parameters such as a local reference time, a local reference frequency, and a local reference phase. In further implementations, the communication system includes a global reference station configured to exchange synchronization signals with the navigation subsystems of at least the first and second stations. The synchronization signals represent global reference parameters for the communication system that comprise a global reference time. The global reference parameters may also include one or both of a global reference frequency and a global reference phase.

In some implementations, the control subsystem of the first and second stations includes an optical detector optically coupled to the one or more photonic crystal receivers and configured to generate a set of spectroscopic data for each photonic crystal receiver. The set of spectroscopic data is based on the output optical signal from the photonic crystal receiver and represents one or more properties of the input beam of RF electromagnetic radiation. The one or more properties of the input beam of RF electromagnetic radiation may include at least one of an intensity, a phase, a frequency, or a polarization of the input beam of RF electromagnetic radiation.

In implementation where the control system includes the optical subsystem, the first and second stations may each include a data processing subsystem in communication with the control subsystem. The data processing subsystem is configured to perform operations that include generating a first time series of data based on the sets of spectroscopic data received from the optical detector over time. The first time series of data represents information transmitted from another station of the communication system. The operations also include generating control signals for the modulation electronics based on a second time series of data received from a communication interface of the first or second station. The control signals represent the one or more properties of the first input optical signals over time. The second time series of data represent information to be transmitted to another station of the communication system.

In some implementations, the control subsystem of the first and second stations includes a reference antenna electromagnetically coupled to at least one photonic crystal receiver of the transceiver. The reference antenna is configured to generate a reference RF electromagnetic radiation having one or more controlled properties that comprise at least one of a controlled amplitude, a controlled frequency, or a controlled phase. During operation, the reference antenna may superimpose the reference RF electromagnetic radiation onto the input beam of RF electromagnetic radiation received by a photonic crystal receiver. Such supposition may cause interference between the reference RF electromagnetic radiation and the input beam of RF electromagnetic radiation, thus allowing the phase and frequency of the input beam of RF electromagnetic radiation to be determined relative to a reference field of the reference RF electromagnetic radiation.

In some aspects of what is described, a communication system may be described by the following examples:

Example 1. A communication system comprising:
 a first station comprising:
  a photonic crystal maser comprising:
   a photonic crystal structure formed of dielectric material and having an array of cavities and an elongated slot, the elongated slot disposed in a defect region of the array of cavities, and
   a vapor disposed in the elongated slot and operable to emit a target RF electromagnetic radiation in response to receiving an optical signal,
   wherein the array of cavities and the elongated slot define a waveguide configured to form the target RF electromagnetic radiation, when emitted, into a beam, the beam of target RF electromagnetic radiation representing information to be transmitted to a second station of the communication system,
  a laser subsystem comprising:
   a pump laser optically coupled to the elongated slot and configured to generate the optical signal, and
   signal processing electronics in communication with the pump laser and configured to control one or more properties of the optical signal, the one or more properties of the optical signal comprising at least one of an intensity, a phase, or a frequency of the optical signal, and
  a tracking subsystem configured to control an orientation of the photonic crystal maser, thereby pointing the beam of target RF electromagnetic radiation towards a target location; and
 the second station, comprising a receiver configured to couple to the beam of target RF electromagnetic radiation.

Example 2. The communication system of example 1,
 wherein the target location is a first target location; and
 wherein the second station comprises a second tracking subsystem configured to control an orientation of the receiver, thereby pointing the receiver towards a second target location.

Example 3. The communication system of example 2, wherein the first and second stations are disposed at, respectively, the second and first target locations.

Example 4. The communication system of example 2, comprising:
 a relay station disposed at a relay location and configured to receive and transmit beams of target RF electromagnetic radiation;
 wherein one or both the first and second target locations correspond to the relay location.

Example 5. The communication system of example 1 or any one of examples 2-4, wherein the waveguide is configured to decrease a group velocity of the target RF electromagnetic radiation along a direction parallel to an axis of the elongated slot.

Example 6. The communication system of example 1 or any one of examples 2-5, wherein the photonic crystal maser comprises an output coupler configured to impedance match the beam of target RF electromagnetic radiation to an ambient environment of the photonic crystal maser.

Example 7. The communication system of example 6, wherein the output coupler is an integral part of the photonic crystal structure.

Example 8. The communication system of example 6 or example 7, wherein the output coupler terminates in a tapered end and comprises:
 a narrow portion aligned with the tapered end; and
 an array of co-planar segments extending outward from the narrow portion and having a periodic spacing therealong, the array of co-planar segments configured to filter a polarization of the beam of target RF electromagnetic radiation.

Example 9. The communication system of example 1 or any one of examples 2-8,
 wherein the first station comprises a reference RF subsystem configured to generate a reference RF electromagnetic radiation having one or both of a controlled frequency and a controlled phase; and
 wherein the photonic crystal maser comprises an input coupler configured to couple the reference RF electromagnetic radiation to the waveguide.

Example 10. The communication system of example 9, wherein the input coupler is an integral part of the photonic crystal structure.

Example 11. The communication system of example 1 or any one of examples 2-10,
 wherein the receiver is a photonic crystal receiver that comprises:
  a second photonic crystal structure formed of dielectric material and having a second array of cavities and a second elongated slot, the second elongated slot disposed in a defect region of the second array of cavities,
  an antenna structure configured to couple the beam of target RF electromagnetic radiation to a second waveguide defined by the second array of cavities and the second elongated slot, the second waveguide configured to concentrate the coupled beam in the second elongated slot, and
  a second vapor disposed in the second elongated slot; and wherein the second station comprises:
a second laser subsystem comprising:
one or more input lasers optically coupled to the second elongated slot and configured to provide input optical signals thereto, the input optical signals adapted to interact with one or more electronic transitions of the second vapor,
an optical subsystem configured to generate spectroscopic data based on output optical signals from the second vapor, the spectroscopic data representing one or more properties of the beam of target RF electromagnetic radiation, and
a data processing subsystem configured to generate a time series of data based on the spectroscopic data over time, the time series of data representing the information transmitted from the first station.

Example 12. The communication system of example 11, wherein the antenna structure is an integral part of the second photonic crystal structure.

Example 13. The communication system of example 11 or example 12, wherein the second waveguide is configured to decrease a group velocity of the coupled beam of target RF electromagnetic radiation along a direction parallel to an axis of the second elongated slot.

Example 14. The communication system of example 11 or any one of examples 12-13, wherein the one or more properties of the beam of target RF electromagnetic radiation comprise at least one of an intensity, a phase, or a frequency of the beam.

Example 15. The communication system of example 11 or any one of examples 12-14,
wherein the antenna structure comprises a polarizer configured to filter a polarization of the beam of target RF electromagnetic radiation; and
wherein the one or more properties of the beam of target RF electromagnetic radiation comprise a polarization of the beam of target RF electromagnetic radiation.

Example 16. The communication system of example 11 or any one of examples 12-15,
wherein the second station comprises a reference antenna configured to generate a second reference RF electromagnetic radiation, the second RF electromagnetic radiation having one or more controlled properties that comprise at least one of a controlled amplitude, a controlled frequency, or a controlled phase; and
wherein the reference antenna is electromagnetically coupled to the antenna structure of the photonic crystal receiver.

In some aspects of what is described, a method of communicating information using radiofrequency (RF) electromagnetic radiation may be described by the following examples:

Example 17. A method of communicating information using radiofrequency (RF) electromagnetic radiation, the method comprising:
generating, at a first station, a beam of target RF electromagnetic radiation representing information to be transmitted to a second station, the first station comprising:
a photonic crystal maser comprising:
a photonic crystal structure formed of dielectric material and having an array of cavities and an elongated slot, the elongated slot disposed in a defect region of the array of cavities, and
a vapor disposed in the elongated slot and operable to emit a target RF electromagnetic radiation in response to receiving an optical signal,
wherein the array of cavities and the elongated slot define a waveguide configured to form the target RF electromagnetic radiation, when emitted, into the beam of target RF electromagnetic radiation;
receiving the beam of target RF electromagnetic radiation at the second station, the second station comprising a receiver configured to couple to the beam of target RF electromagnetic radiation.

Example 18. The method of example 17,
wherein the first station comprises a laser subsystem having a pump laser optically coupled to the elongated slot; and
wherein generating the beam of target RF electromagnetic radiation comprises generating the optical signal by operation of the pump laser.

Example 19. The method of example 18,
wherein the laser subsystem comprises signal processing electronics in communication with the pump laser; and
wherein generating the optical signal comprises controlling, by operation of the signal processing electronics, one or more properties of the optical signal, the one or more properties of the optical signal comprising at least one of an intensity, a phase, or a frequency of the optical signal.

Example 20. The method of example 17 or any one of examples 18-19, comprising:
altering, by operation of a tracking subsystem of the first station, an orientation of the photonic crystal maser to point the beam of target RF electromagnetic radiation towards a target location.

Example 21. The method of example 20,
wherein the target location is a first target location; and
wherein the method comprises altering, by operation of a tracking subsystem of the second station, an orientation of the receiver to point the receiver towards a second target location.

Example 22. The method of example 21, wherein the first and second stations are disposed at, respectively, the second and first target locations.

Example 23. The method of example 21,
wherein the first and second target locations correspond to a location of a relay station; and
wherein the method comprises transmitting, by operation of the relay station, a second beam of target RF electromagnetic radiation to the second station in response to receiving, at the relay station, the beam of target RF electromagnetic radiation from the first station.

Example 24. The method of example 17 or any one of examples 18-23, wherein generating the beam of target RF electromagnetic radiation comprises decreasing a group velocity of the target RF electromagnetic radiation along a direction parallel to an axis the elongated slot.

Example 25. The method of example 17 or any one of examples 18-24,
wherein the photonic crystal maser comprises an output coupler; and
wherein generating the beam of target RF electromagnetic radiation comprises impedance matching, by operation of the output coupler, the beam of target RF electromagnetic radiation to an ambient environment of the photonic crystal maser.

Example 26. The method of example 17 or any one of examples 18-25,
wherein the photonic crystal maser comprises an input coupler; and wherein the method comprises:
  generating a reference RF electromagnetic radiation having one or both of a controlled frequency and a controlled phase, and
  coupling, by operation of the input coupler, the reference RF electromagnetic radiation to the waveguide.

Example 27. The method of example 17 or any one of examples 18-26,
  wherein the receiver is a photonic crystal receiver that comprises:
    a second photonic crystal structure formed of dielectric material and having a second array of cavities and a second elongated slot, the second elongated slot disposed in a defect region of the second array of cavities,
    an antenna structure aligned with the elongated slot, and
    a second vapor disposed in the second elongated slot; and
  wherein receiving the beam of target RF electromagnetic radiation comprises coupling, by operation of the antenna structure, the beam of target RF electromagnetic radiation to a second waveguide defined by the second array of cavities and the second elongated slot.

Example 28. The method of example 27, wherein receiving the beam of RF electromagnetic radiation comprises concentrating, by operation of the second waveguide, the coupled beam in the second elongated slot.

Example 29. The method of example 27 or example 28,
  wherein the second station comprises:
    a second laser subsystem comprising:
      one or more input lasers optically coupled to the second elongated slot, and
      an optical subsystem optically coupled to the second elongated slot;
  wherein the method comprises:
    generating input optical signals for the second vapor by operation of the one or more pump lasers, the input optical signals adapted to interact with one or more electronic transitions of the second vapor, and
    generating, by operation of the optical subsystem, spectroscopic data based on output optical signals from the second vapor, the spectroscopic data representing one or more properties of the beam of target RF electromagnetic radiation.

Example 30. The method of example 29,
  wherein the second laser subsystem comprises a data processing subsystem in communication with the optical subsystem; and
  wherein the method comprises:
    generating, by operation of the data processing subsystem, a time series of data based on spectroscopic data received from the optical subsystem over time, the time series of data representing the information transmitted from the first station.

In some aspects of what is described, a communication system may be described by the following examples:

Example 31. A communication system comprising:
  first and second stations, each comprising:
    a transceiver having one or more photonic crystal masers and one or more photonic crystal receivers, wherein:
      each photonic crystal maser is configured to generate an output beam of RF electromagnetic radiation in response to receiving a first input optical signal, the output beam representing information to be transmitted to another station of the communication system, and
      each photonic crystal receiver is configured to generate an output optical signal in response to receiving an input beam of RF electromagnetic radiation and a second input optical signal, the input beam representing information received from another station of the communication system;
    a control subsystem comprising:
      one or more lasers optically coupled to the one or more photonic crystal masers and the one or more photonic crystal receivers and configured to generate the first and second input optical signals,
      modulation electronics in communication with the one or more lasers and configured to control one or more properties of the first input optical signal, the one or more properties of the first input optical signal comprising an intensity, a frequency, or a phase of the first input optical signal, and
      demodulation electronics in communication with the one or more lasers and configured to control one or more properties of the second input optical signal, the one or more properties of the second input optical signal comprising an intensity, a frequency, or a phase of the second input optical signal; and
    a tracking subsystem configured to control an orientation of the transceiver, thereby pointing the one or more photonic crystal masers and the one or more photonic crystal receivers at a target location.

Example 32. The communication system of example 31, wherein the first and second stations each comprise:
  a navigation subsystem in communication with the control subsystem and the tracking subsystem, the navigation subsystem comprising:
    positioning electronics configured to determine a position of the first or second station; and
    timing electronics configured to set local reference parameters for the first or second station, the local reference parameters comprising a local reference time.

Example 33. The communication system of example 32, wherein the local reference parameters comprise one or both of a local reference frequency and a local reference phase.

Example 34. The communication system of example 32 or example 33, comprising:
  a global reference station configured to exchange synchronization signals with the navigation subsystems of at least the first and second stations, the synchronization signals representing global reference parameters for the communication system that comprise a global reference time.

Example 35. The communication system of example 34, wherein the global reference parameters comprise one or both of a global reference frequency and a global reference phase.

Example 36. The communication system of example 31 or any one of examples 32-35, wherein control subsystem comprises:
  an optical detector optically coupled to the one or more photonic crystal receivers and configured to generate a set of spectroscopic data for each photonic crystal receiver, the set of spectroscopic data based on the output optical signal from the photonic crystal receiver and representing one or more properties of the input beam of RF electromagnetic radiation.

Example 37. The communication system of example 36, wherein the one or more properties of the input beam of RF electromagnetic radiation comprise at least one of an intensity, a phase, a frequency, or a polarization of the input beam of RF electromagnetic radiation.

Example 38. The communication system of example 36 or example 37, wherein the first and second stations each comprise:
- a data processing subsystem in communication with the control subsystem and configured to perform operations comprising:
  - generating a first time series of data based on the sets of spectroscopic data received from the optical detector over time, the first time series of data representing information transmitted from another station of the communication system; and
  - generating control signals for the modulation electronics based on a second time series of data received from a communication interface of the first or second station, the control signals representing the one or more properties of the first input optical signals over time, the second time series of data representing information to be transmitted to another station of the communication system.

Example 39. The communication system of example 31 or any one of examples 32-38, wherein the control subsystem comprises:
- a reference RF oscillator electromagnetically coupled to at least one photonic crystal maser, the reference RF oscillator configured to generate a reference RF electromagnetic radiation having one or both of a controlled frequency and a controlled phase.

Example 40. The communication system of example 31 or any one of examples 32-39, wherein the control subsystem comprises:
- a reference antenna electromagnetically coupled to at least one photonic crystal receiver of the transceiver, the reference antenna configured to generate a reference RF electromagnetic radiation having one or more controlled properties that comprise at least one of a controlled amplitude, a controlled frequency, or a controlled phase.

Example 41. The communication system of example 31 or any one of examples 32-40, wherein the one or more photonic crystal masers comprise a pair of photonic crystal masers that are configured to produce respective output beams of RF electromagnetic radiation having polarizations orthogonal to each other.

Example 42. The communication system of example 31 or any one of examples 32-41, wherein the one or more photonic crystal receivers comprise a pair of photonic crystal receivers that are configured to process respective input beams of RF electromagnetic at polarizations that are orthogonal to each other.

Example 43. The communication system of example 31 or any one of examples 32-42, wherein the first station is disposed at the target location of the second station and the second station is disposed at the target location of the first station.

Example 44. The communication system of example 1 or any one of examples 32-43, comprising:
- a relay station disposed at a relay location and configured to receive and transmit beams of target RF electromagnetic radiation;

wherein the relay location serves as the target location for the tracking subsystems of one or both of the first and second stations.

In some aspects of what is described, a method of communicating information using radiofrequency (RF) electromagnetic radiation may be described by the following examples:

Example 45. A method of communicating information using radiofrequency (RF) electromagnetic radiation, the method comprising:
- transmitting a beam of RF electromagnetic radiation between first and second stations of a communication system, the first and second stations each comprising:
  - a transceiver having one or more photonic crystal masers and one or more photonic crystal receivers, wherein:
    - each photonic crystal maser is configured to generate an output beam of RF electromagnetic radiation in response to receiving a first input optical signal, the output beam representing information to be transmitted to another station of the communication system, and
    - each photonic crystal receiver is configured to generate an output optical signal in response to receiving an input beam of RF electromagnetic radiation and a second input optical signal, the input beam representing information received from another station of the communication system,
  - a control subsystem comprising one or more lasers optically coupled to the one or more photonic crystal masers and the one or more photonic crystal receivers and configured to generate the first and second input optical signals, and
  - a tracking subsystem configured to control an orientation of the transceiver, thereby pointing the one or more photonic crystal masers and the one or more photonic crystal receivers at a target location.

Example 46. The method of example 45,
- wherein the first or second station is an originating station for the beam of RF electromagnetic radiation; and
- wherein transmitting the beam of RF electromagnetic radiation comprises generating, by operation of the one or more photonic crystal masers at the originating station, one or more respective output beams of RF electromagnetic radiation.

Example 47. The method of example 45 or example 46, wherein transmitting a beam of RF electromagnetic radiation comprises:
- transmitting a first beam of RF electromagnetic radiation from the first station to the second station; and
- transmitting a second beam of RF electromagnetic radiation from the second station to the first station, the second beam transmitted, at least in part, concurrently with the first beam.

Example 48. The method of example 45 or any one of examples 46-47,
- wherein the control subsystem of each of the first and second stations comprises modulation electronics in communication with the one or more lasers;
- wherein the first or second station is an originating station for the beam of RF electromagnetic radiation; and
- wherein the method comprises controlling, by operation of the modulation electronics of the originating station, one or more properties of the first input optical signal generated by the one or more lasers, the one or more properties of the first input optical signal comprising an intensity, a frequency, or a phase of the first input optical signal.

Example 49. The method of example 45 or any one of examples 46-48,
wherein the control subsystem of each of the first and second stations comprises demodulation electronics in communication with the one or more lasers;
wherein the first or second station is a destination station for the beam of RF electromagnetic radiation; and
wherein the method comprises controlling, by operation of the demodulation electronics of the destination station, one or more properties of the second input optical signal generated by the one or more lasers, the one or more properties of the second input optical signal comprising an intensity, a frequency, or a phase of the second input optical signal.

Example 50. The method of example 45 or any one of examples 46-49,
wherein the control subsystem of each of the first and second stations comprises an optical detector optically coupled to the one or more photonic crystal receivers;
wherein the first or the second station is a destination station for the beam of RF electromagnetic radiation; and
wherein the method comprises generating, by operation of the optical detector of the destination station, a set of spectroscopic data for each photonic crystal receiver of the destination station, the set of spectroscopic data based on the output optical signal from the photonic crystal receiver and representing one or more properties of the input beam of RF electromagnetic radiation.

Example 51. The method of example 50, wherein the one or more properties of the input beam of RF electromagnetic radiation comprise at least one of an intensity, a phase, a frequency, or a polarization of the input beam of RF electromagnetic radiation.

Example 52. The method of example 50 or example 51,
wherein the first and second stations each comprise a data processing subsystem in communication with the control subsystem; and
wherein the method comprises generating, by operation of the data processing subsystem of the destination station, a first time series of data based on the sets of spectroscopic data received from the optical detector over time, the first time series of data representing information transmitted from another station of the communication system.

Example 53. The method of example 50 or any one of examples 51-52, comprising:
wherein the first and second stations each comprise:
a data processing subsystem in communication with the control subsystem, and a communication interface; and
wherein the method comprises generating, by operation of the data processing subsystem of the destination station, control signals for the modulation electronics of the control subsystem based on a second time series of data received from the communication interface, the control signals representing the one or more properties of the first input optical signals over time, the second time series of data representing information to be transmitted to another station of the communication system.

Example 54. The method of example 45 or any one of examples 46-53,
wherein the first and second stations each comprise a navigation subsystem in communication with the control subsystem and the tracking subsystem, the navigation subsystem having positioning electronics and timing electronics; and
wherein the method comprises:
determining a position of the first or second station by operation of the positioning electronics of, respectively, the first or second station, and
setting local reference parameters for the first or second station by operation of the timing electronics of, respectively, the first or second station, the local reference parameters comprising a local reference time.

Example 55. The method of example 54, wherein the local reference parameters comprise one or both of a local reference frequency and a local reference phase Example 56. The method of example 54 or example 55, comprising:
exchanging synchronization signals between a global reference station and the navigation subsystems of at least the first and second stations, the synchronization signals representing global reference parameters for the communication system that comprise a global reference time.

Example 57. The method of example 56, wherein the global reference parameters comprise one or both of a global reference frequency and a global reference phase.

Example 58. The method of example 45 or any one of examples 46-57,
wherein the control subsystem for each of the first and second stations comprises a reference RF oscillator electromagnetically coupled to at least one photonic crystal maser; and
wherein the method comprises:
generating, by operation of the reference RF oscillator, a reference RF electromagnetic radiation having one or both of a controlled frequency and a controlled phase, and
coupling, by operation of an input coupler of the at least one photonic crystal maser, the reference RF electromagnetic radiation to a waveguide of the at least one photonic crystal maser.

Example 59. The method of example 45 or any one of examples 46-58,
wherein the control subsystem for each of the first and second stations comprises a reference antenna electromagnetically coupled to at least one photonic crystal receiver of the transceiver; and
wherein the method comprises:
generating, by operation of the reference antenna, a reference RF electromagnetic radiation having one or more controlled properties that comprise at least one of a controlled amplitude, a controlled frequency, or a controlled phase; and
coupling, by operation of an input coupler of the at least one photonic crystal receiver, the reference RF electromagnetic radiation to a waveguide of the at least one photonic crystal receiver.

Example 60. The method of example 45 or any one of examples 46-59,
wherein a relay station is disposed at a relay location and is configured to receive and transmit beams of target RF electromagnetic radiation; and
wherein the method comprises altering, by operation of the tracking subsystem of the first or second station, an orientation of a respective transceiver to point the one or more photonic crystal masers and the one or more photonic crystal receivers of the respective transceiver at the relay location.

While this specification contains many details, these should not be understood as limitations on the scope of what may be claimed, but rather as descriptions of features specific to particular examples. Certain features that are described in this specification or shown in the drawings in the context of separate implementations can also be combined. Conversely, various features that are described or shown in the context of a single implementation can also be implemented in multiple embodiments separately or in any suitable sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems can generally be integrated together in a single product or packaged into multiple products.

A number of embodiments have been described. Nevertheless, it will be understood that various modifications can be made. Accordingly, other embodiments are within the scope of the following claims.

What is claimed is:

1. A communication system comprising:
   a first station comprising:
      a photonic crystal maser comprising:
         a photonic crystal structure formed of dielectric material and having an array of cavities and an elongated slot, the elongated slot disposed in a defect region of the array of cavities, and
         a vapor disposed in the elongated slot and operable to emit a target RF electromagnetic radiation in response to receiving an optical signal,
         wherein the array of cavities and the elongated slot define a waveguide configured to form the target RF electromagnetic radiation, when emitted, into a beam, the beam of target RF electromagnetic radiation representing information to be transmitted to a second station of the communication system,
      a laser subsystem comprising:
         a pump laser optically coupled to the elongated slot and configured to generate the optical signal, and
         signal processing electronics in communication with the pump laser and configured to control one or more properties of the optical signal, the one or more properties of the optical signal comprising at least one of an intensity, a phase, or a frequency of the optical signal, and
      a tracking subsystem configured to control an orientation of the photonic crystal maser, thereby pointing the beam of target RF electromagnetic radiation towards a target location; and
   the second station, comprising a receiver configured to couple to the beam of target RF electromagnetic radiation.

2. The communication system of claim 1,
   wherein the target location is a first target location; and
   wherein the second station comprises a second tracking subsystem configured to control an orientation of the receiver, thereby pointing the receiver towards a second target location.

3. The communication system of claim 2, wherein the first and second stations are disposed at, respectively, the second and first target locations.

4. The communication system of claim 2, comprising:
   a relay station disposed at a relay location and configured to receive and transmit beams of target RF electromagnetic radiation;
   wherein one or both the first and second target locations correspond to the relay location.

5. The communication system of claim 1, wherein the waveguide is configured to decrease a group velocity of the target RF electromagnetic radiation along a direction parallel to an axis of the elongated slot.

6. The communication system of claim 1, wherein the photonic crystal maser comprises an output coupler configured to impedance match the beam of target RF electromagnetic radiation to an ambient environment of the photonic crystal maser.

7. The communication system of claim 6, wherein the output coupler is an integral part of the photonic crystal structure.

8. The communication system of claim 6, wherein the output coupler terminates in a tapered end and comprises:
   a narrow portion aligned with the tapered end; and
   an array of co-planar segments extending outward from the narrow portion and having a periodic spacing therealong, the array of co-planar segments configured to filter a polarization of the beam of target RF electromagnetic radiation.

9. The communication system of claim 1,
   wherein the first station comprises a reference RF subsystem configured to generate a reference RF electromagnetic radiation having one or both of a controlled frequency and a controlled phase; and
   wherein the photonic crystal maser comprises an input coupler configured to couple the reference RF electromagnetic radiation to the waveguide.

10. The communication system of claim 9, wherein the input coupler is an integral part of the photonic crystal structure.

11. The communication system of claim 1,
   wherein the receiver is a photonic crystal receiver that comprises:
      a second photonic crystal structure formed of dielectric material and having a second array of cavities and a second elongated slot, the second elongated slot disposed in a defect region of the second array of cavities,
      an antenna structure configured to couple the beam of target RF electromagnetic radiation to a second waveguide defined by the second array of cavities and the second elongated slot, the second waveguide configured to concentrate the coupled beam in the second elongated slot, and
      a second vapor disposed in the second elongated slot; and
   wherein the second station comprises:
      a second laser subsystem comprising:
         one or more input lasers optically coupled to the second elongated slot and configured to provide input optical signals thereto, the input optical signals adapted to interact with one or more electronic transitions of the second vapor, an optical subsystem configured to generate spectroscopic data based on output optical signals from the second vapor, the spectroscopic data representing one or more properties of the beam of target RF electromagnetic radiation, and a data processing subsystem configured to generate a time series of data based on the spectroscopic data over time, the time series of data representing the information transmitted from the first station.

12. The communication system of claim 11, wherein the antenna structure is an integral part of the second photonic crystal structure.

13. The communication system of claim 11, wherein the second waveguide is configured to decrease a group velocity of the coupled beam of target RF electromagnetic radiation along a direction parallel to an axis of the second elongated slot.

14. The communication system of claim 11, wherein the one or more properties of the beam of target RF electromagnetic radiation comprise at least one of an intensity, a phase, or a frequency of the beam.

15. The communication system of claim 11,
wherein the antenna structure comprises a polarizer configured to filter a polarization of the beam of target RF electromagnetic radiation; and
wherein the one or more properties of the beam of target RF electromagnetic radiation comprise a polarization of the beam of target RF electromagnetic radiation.

16. The communication system of claim 11,
wherein the second station comprises a reference antenna configured to generate a second reference RF electromagnetic radiation, the second RF electromagnetic radiation having one or more controlled properties that comprise at least one of a controlled amplitude, a controlled frequency, or a controlled phase; and
wherein the reference antenna is electromagnetically coupled to the antenna structure of the photonic crystal receiver.

17. A method of communicating information using radiofrequency (RF) electromagnetic radiation, the method comprising:
generating, at a first station, a beam of target RF electromagnetic radiation representing information to be transmitted to a second station, the first station comprising:
a photonic crystal maser comprising:
a photonic crystal structure formed of dielectric material and having an array of cavities and an elongated slot, the elongated slot disposed in a defect region of the array of cavities, and
a vapor disposed in the elongated slot and operable to emit a target RF electromagnetic radiation in response to receiving an optical signal,
wherein the array of cavities and the elongated slot define a waveguide configured to form the target RF electromagnetic radiation, when emitted, into the beam of target RF electromagnetic radiation;
receiving the beam of target RF electromagnetic radiation at the second station, the second station comprising a receiver configured to couple to the beam of target RF electromagnetic radiation.

18. The method of claim 17,
wherein the first station comprises a laser subsystem having a pump laser optically coupled to the elongated slot; and
wherein generating the beam of target RF electromagnetic radiation comprises generating the optical signal by operation of the pump laser.

19. The method of claim 18,
wherein the laser subsystem comprises signal processing electronics in communication with the pump laser; and
wherein generating the optical signal comprises controlling, by operation of the signal processing electronics, one or more properties of the optical signal, the one or more properties of the optical signal comprising at least one of an intensity, a phase, or a frequency of the optical signal.

20. The method of claim 17, comprising:
altering, by operation of a tracking subsystem of the first station, an orientation of the photonic crystal maser to point the beam of target RF electromagnetic radiation towards a target location.

21. The method of claim 20,
wherein the target location is a first target location; and
wherein the method comprises altering, by operation of a tracking subsystem of the second station, an orientation of the receiver to point the receiver towards a second target location.

22. The method of claim 21, wherein the first and second stations are disposed at, respectively, the second and first target locations.

23. The method of claim 21,
wherein the first and second target locations correspond to a location of a relay station; and
wherein the method comprises transmitting, by operation of the relay station, a second beam of target RF electromagnetic radiation to the second station in response to receiving, at the relay station, the beam of target RF electromagnetic radiation from the first station.

24. The method of claim 17, wherein generating the beam of target RF electromagnetic radiation comprises decreasing a group velocity of the target RF electromagnetic radiation along a direction parallel to an axis the elongated slot.

25. The method of claim 17,
wherein the photonic crystal maser comprises an output coupler; and
wherein generating the beam of target RF electromagnetic radiation comprises impedance matching, by operation of the output coupler, the beam of target RF electromagnetic radiation to an ambient environment of the photonic crystal maser.

26. The method of claim 17,
wherein the photonic crystal maser comprises an input coupler; and
wherein the method comprises:
generating a reference RF electromagnetic radiation having one or both of a controlled frequency and a controlled phase, and
coupling, by operation of the input coupler, the reference RF electromagnetic radiation to the waveguide.

27. The method of claim 17,
wherein the receiver is a photonic crystal receiver that comprises:
a second photonic crystal structure formed of dielectric material and having a second array of cavities and a second elongated slot, the second elongated slot disposed in a defect region of the second array of cavities, an antenna structure aligned with the elongated slot, and a second vapor disposed in the second elongated slot; and wherein receiving the beam of target RF electromagnetic radiation comprises coupling, by operation of the antenna structure, the beam of target RF electromagnetic radiation to a second waveguide defined by the second array of cavities and the second elongated slot.

28. The method of claim 27, wherein receiving the beam of RF electromagnetic radiation comprises concentrating, by operation of the second waveguide, the coupled beam in the second elongated slot.

29. The method of claim 27,
wherein the second station comprises:
a second laser subsystem comprising:
one or more input lasers optically coupled to the second elongated slot, and
an optical subsystem optically coupled to the second elongated slot;
wherein the method comprises:
generating input optical signals for the second vapor by operation of the one or more pump lasers, the input optical signals adapted to interact with one or more electronic transitions of the second vapor, and
generating, by operation of the optical subsystem, spectroscopic data based on output optical signals from the second vapor, the spectroscopic data representing one or more properties of the beam of target RF electromagnetic radiation.

30. The method of claim 29,
wherein the second laser subsystem comprises a data processing subsystem in communication with the optical subsystem; and
wherein the method comprises:
generating, by operation of the data processing subsystem, a time series of data based on spectroscopic data received from the optical subsystem over time, the time series of data representing the information transmitted from the first station.

* * * * *

UNITED STATES PATENT AND TRADEMARK OFFICE
CERTIFICATE OF CORRECTION

PATENT NO. : 11,533,101 B1
APPLICATION NO. : 17/667281
DATED : December 20, 2022
INVENTOR(S) : Pecen et al.

It is certified that error appears in the above-identified patent and that said Letters Patent is hereby corrected as shown below:

In the Specification

Column 12, Line 63, delete "114." and insert -- 314. -- therefor.

Column 14, Line 12, delete "102" and insert -- 302 -- therefor.

Column 14, Line 13, delete "108." and insert -- 308. -- therefor.

Column 14, Line 32, delete "1302" and insert -- 302 -- therefor.

Column 14, Line 38, delete "120." and insert -- 320. -- therefor.

Column 15, Line 22, delete "214" and insert -- 314 -- therefor.

Column 15, Line 27, delete "126" and insert -- 326 -- therefor.

Column 15, Line 38, delete "318" and insert -- 332 -- therefor.

Column 21, Line 42, delete "150" and insert -- 350 -- therefor.

Column 40, Line 17, after "phrase", insert -- . --.

Signed and Sealed this
Fourteenth Day of February, 2023

*Katherine Kelly Vidal*
Katherine Kelly Vidal
*Director of the United States Patent and Trademark Office*